(12) United States Patent
Vervaeke et al.

(10) Patent No.: US 7,902,820 B2
(45) Date of Patent: Mar. 8, 2011

(54) METHOD AND APPARATUS FOR DETECTING SPATIALLY VARYING AND TIME-DEPENDENT MAGNETIC FIELDS

(75) Inventors: Koen Vervaeke, Leuven (BE); Gustaaf Borghs, Leuven (BE); Victor V. Moshchalkov, Leuven (BE)

(73) Assignees: IMEC, Leuven (BE); Katholieke Universiteit Leuven, Leuven (BE)

( * ) Notice: Subject to any disclaimer, the term of this patent is extended or adjusted under 35 U.S.C. 154(b) by 1155 days.

(21) Appl. No.: 11/411,433

(22) Filed: Apr. 26, 2006

(65) Prior Publication Data

US 2007/0046287 A1    Mar. 1, 2007

(30) Foreign Application Priority Data

May 3, 2005  (GB) .................................. 0508931.3
Oct. 31, 2005 (GB) .................................. 0522095.9

(51) Int. Cl.
*G01R 33/07* (2006.01)
*G01B 7/14* (2006.01)

(52) U.S. Cl. ..................................... 324/251; 324/207.2
(58) Field of Classification Search .................. 324/251, 324/252, 207.2
See application file for complete search history.

(56) References Cited

U.S. PATENT DOCUMENTS

| 5,406,202 | A | 4/1995 | Mehrgardt et al. |
| 5,640,090 | A * | 6/1997 | Furuya et al. .................. 324/251 |
| 6,768,301 | B1 * | 7/2004 | Hohe et al. ..................... 324/251 |
| 2004/0217756 | A1 | 11/2004 | Johnson et al. |

FOREIGN PATENT DOCUMENTS

| DE | 199 48 618 A1 | 5/2001 |
| EP | 1136835 A | 9/2001 |
| EP | 1 469 311 A1 | 10/2004 |

OTHER PUBLICATIONS

Popovic, Hall Effect Devices, magnetic field sensor and characterization of semiconductors, Adam Hilger, p. 252 (1991).
European Search Report & Written Opinion dated Jul. 26, 2006 for EP Application No. 06009118.

* cited by examiner

*Primary Examiner* — Reena Aurora
(74) *Attorney, Agent, or Firm* — Knobbe Martens Olson & Bear LLP

(57) ABSTRACT

Certain inventive aspects provide local field imaging with high spatial, time and field resolution by using an array of Hall effect sensors that can be individually read out. The design combines semiconductor Hall sensors and switches that isolate the addressed Hall sensor from the rest of the array. The compact design allows for large and very dense Hall sensor arrays that can be read out in a straightforward way.

62 Claims, 20 Drawing Sheets

(a)

(b)

(c)

(d)

(a)

(b)

(c)

(a)

(b)

(c)

(d)

(e)

(f)

METHOD AND APPARATUS FOR DETECTING SPATIALLY VARYING AND TIME-DEPENDENT MAGNETIC FIELDS

BACKGROUND OF THE INVENTION

1. Technical Field of the Invention

The field relates generally to a two-dimensional (2D) Hall sensor array with high spatial, magnetic field and time resolution, for detecting spatially varying and time-dependent magnetic fields and, more particularly, to a system and method for individually addressing Hall sensors from a plurality of integrated Hall sensors and perceiving their individual response to a magnetic environment for magnetic field mapping, more particularly for high-precision positioning and magnetic field detection and imaging of magnetic field variations in time or in space.

2. Description of the Related Technology

Existing magnetic field detecting devices based on SQUID, GMR and Hall effect sensors are currently available only as individual sensors or one-dimensional arrays. This inevitably involves the need of either two-dimensional or one-dimensional scans if the spatial variation of the local magnetic field over a two-dimensional area has to be mapped. Such scans are sequential by definition and therefore are slow and time-consuming processes.

The most widely used magnetic field sensor is the Hall effect sensor. This sensor provides a very fast response and high sensitivity. It is quantitative, non-invasive and applicable in a large temperature range and in external magnetic fields.

Nowadays, Hall sensors are commonly used in a broad range of applications such as remote switches, flow rate sensors, sequencing sensors, proximity sensors, position sensors, speed sensors, brushless DC motor sensors, RPM sensors, current sensors, temperature or pressure sensors, magnetic card readers, throttle angle sensors in cars, automotive sensors, etc.

In most of these applications, one or more permanent magnets are used in combination with one or more individual Hall sensors and their relative displacement is being measured through the output of the Hall sensor or sensors.

Another application is Scanning Hall Probe Microscopy (SHPM) in which an individual Hall sensor is scanned over a magnetic surface in order to construct a two-dimensional image of the magnetic field distribution.

However, most existing Hall-sensor-based devices make use of either individual sensors or their one-dimensional arrays. Positioning of a magnetic object, for example, such as a permanent magnet, is currently being performed with a limited number (one or two) of individual Hall sensors, resulting in a limited position resolution.

A two-dimensional array of Hall-effect based magnetic field sensors is described in EP-1 469 311 A1. The Hall effect sensors in this array are formed by the channel of a Metal-Oxide-Semiconductor (MOS) structure, which allows them to be switched on and off. However, MOS Hall effect devices have some serious drawbacks: the carrier mobility in the channel is only half its value in the bulk of the semiconductor; the 1/f noise of a MOS device is usually several orders of magnitude higher than that of a comparable bulk device; and the surface might be insufficiently stable [R. S. Popovic, *Hall effect devices, magnetic field sensors and characterization of semiconductors*, Adam Hilger, 1991].

A two-dimensional array of magnetic field gradient sensitive sensors is also described in DE-199 48 618 B4. The sensor elements in this array use the Hall effect in order to detect a magnetic field gradient along a specific direction. These sensors are only sensitive to the gradient and not to the magnetic field itself.

SUMMARY OF CERTAIN INVENTIVE ASPECTS

The spatial resolution of a 2D Hall sensor array is related to both the size of the sensitive part of the Hall sensors, which is preferably between 100 nm and 1 mm, and the distance between two neighbouring Hall sensors, which is preferably between 1 µm and 5 mm. Since lithographic and other techniques used in microelectronics are continually improving, sizes and distances which lie outside of these ranges may become possible in the future.

The magnetic field resolution of individual Hall sensors is related to their magnetic field sensitivity, which is preferably between 10 V/AT and 10000 V/AT, and their minimal detectable field, which is preferably between 1 nT and 1 mT. Values outside these ranges are also possible.

The time resolution of a 2D Hall sensor array is related to the time needed to read out the 2D Hall sensor array. Reading out the 2D Hall sensor array means reading out a part or all of the Hall sensors in the 2D Hall sensor array. The time needed to read out a single Hall sensor in the 2D Hall sensor array is preferably between 1 ns and 1 s. Values outside of this range are also possible. The time needed to read out the 2D Hall sensor array depends then on how many Hall sensors the array contains, which is m*n, in which m and n are natural numbers and denote the number of rows and columns in the 2D Hall sensor array respectively.

The term 'high precision' is used to denote the precision with which positions and magnetic fields are measured and the time scales involved in these measurements, corresponding to the definition of spatial, magnetic field, and time resolution described above.

One inventive aspect provides a magnetic field sensor device which comprises a measuring element, in particular a magnetic measuring element, comprising a semiconductor material, a first means for providing current through said measuring element, said current flowing along a first path between a first set of two contacts, a first means for measuring voltage over a second set of two contacts, each contact of said second set of two contacts being located electrically on different sides of said first path, a first means for electrically isolating said first set of contacts from said second set of contacts, said first means for electrically isolating said first set of contacts from said second set of contacts comprising a first set of at least two switches.

Said first path may be essentially straight when looked upon from above, i.e. in a direction substantially perpendicular to a plane in which the measuring element is provided.

The measuring element may be cross-shaped, being built up of two intersecting cross bars, in which case the contacts of said first set of two contacts and of said second said of two contacts, may each be located at different end portions of a first and a second cross bar respectively. Alternatively, the measuring element may be rectangular or square shaped, in which case the contacts of said first set of two contacts and of said second set of two contacts may each be located at opposite sides of the measuring element respectively. In alternative embodiments, the measuring element may have any suitable shape.

The measuring element may comprise silicon, germanium, GaAs, GaSb, InAs, InSb, InGaAs, InAlAs, InP, GaN or another III-V material. Said measuring element may a heterostructure, e.g. comprising a GaAs/AlGaAs interface or a GaN/AlGaN interface. Alternatively, the measuring element may comprise an organic or polymer material.

In a preferred embodiment, said first set of switches are a first set of transistors.

Said first set of transistors may comprise first areas of said measuring element. Said first areas of said measuring element may form channels of said first set of transistors. Said first areas of said measuring element may at least partially be covered with a conductive layer, said conductive layer forming a control electrode, e.g. gate, of a transistor. Said control electrode may further be separated from said measuring element by an electrically isolating layer, e.g. a gate dielectric.

A device according to certain embodiments may furthermore comprise a second means for providing current through said measuring element, said current flowing along a second path between said second set of two contacts, a second means for measuring voltage over said first set of two contacts, each contact of said first set of two contacts being located electrically on different sides of said second path, and a second means for electrically isolating said first set of contacts from said second set of contacts.

Said second means for electrically isolating said first set of contacts from said second set of contacts may comprise a second set of at least two switches.

Said first means for providing current and said second means for measuring voltage may be the same. Also said second means for providing current and said first means for measuring voltage may be the same.

Said second set of switches may be a second set of transistors. Said second set of transistors may comprise second areas of said measuring element. Said second areas of said measuring element may form channels of said second set of transistors. Said second areas of said measuring element may at least partially be covered with a conductive layer, said conductive layer forming a control electrode of a transistor, e.g. a gate. Said control electrode may further be separated from said measuring element by an electrically isolating layer, e.g. a gate dielectric.

One inventive aspect also provides a device comprising a plurality of magnetic field sensors as set out in any of the embodiments above, wherein said devices are logically organised in rows and columns in a 2-dimensional matrix. Throughout this description, the terms "horizontal" and "vertical" (related to the terms "row" and "column" respectively) are used to provide a co-ordinate system and for ease of explanation only. They do not need to, but may, refer to an actual physical direction of the device. Furthermore, the terms "column" and "row" are used to describe sets of array elements which are linked together. The linking can be in the form of a Cartesian array of rows and columns but is not limited thereto. As will be understood by those skilled in the art, columns and rows can be easily interchanged and it is intended in this disclosure that these terms be interchangeable. Also, non-Cartesian arrays may be constructed and are included within the scope of certain inventive aspects. Accordingly the terms "row" and "column" should be interpreted widely. To facilitate in this wide interpretation, the claims refer to logically organised rows and columns. By this is meant that sets of memory elements are linked together in a topologically linear intersecting manner; however, that the physical or topographical arrangement need not be so. For example, the rows may be circles and the columns radii of these circles and the circles and radii are described as "logically organised" rows and columns. Also, specific names of the various lines, e.g. reset line and first and second select line, are intended to be generic names used to facilitate the explanation and to refer to a particular function and this specific choice of words is not intended to in any way limit certain inventive aspects. It should be understood that all these terms are used only to facilitate a better understanding of the specific structure being described, and are in no way intended to limit certain inventive aspects.

In the 2-dimensional matrix, at least one switch of said first set of switches, for each element in a row, is coupled to a first common electrically conductive line, this for each row. The other switch of said first set of switches, for each element in a row, may be connected to a second common electrically conductive line, this for each row. Said first common electrically conductive line and said second common electrically conductive line may be the same.

In the 2-dimensional matrix, one contact of said first set of contacts for each element in a row, may be coupled to a third common electrically conductive line, for each row. The other contact of said first set of contacts for each element in a row, may be coupled to a fourth common electrically conductive line, for each row.

In the 2-dimensional matrix, one contact of said second set of contacts for each element in a column, may be coupled to a fifth common electrically conductive line, for each column. The other contact of said second set of contacts for each element in a column, may be connected to a sixth common electrically conductive line, for each column.

In the 2-dimensional matrix, at least one switch of said second set of switches, for each element in a column, may be connected to a seventh common electrically conductive line, this for each column. The other switch of said second set of switches, for each element in a column, may be connected to an eighth common electrically conductive line, this for each column. Said seventh common electrically conductive line and said eighth common electrically conductive line may be the same.

A device according to certain embodiments may further comprise a contact to the substrate, said substrate contact being put at a reference potential, e.g. ground potential.

In a further aspect, one inventive aspect provides the use of a device according to embodiments, for performing high-resolution two-dimensional and three-dimensional magnetic imaging.

In a further aspect, one inventive aspect provides the use of a device according to certain embodiments, for defect detection in materials.

In a further aspect, one inventive aspect provides the use of a device according to certain embodiments, for performing finger print detection.

In a further aspect, one inventive aspect provides the use of a device according to certain embodiments, for performing high-resolution two- and three-dimensional positioning, such as e.g. monitoring the position of one or more small permanent magnets relative to a 2-dimensional matrix.

In a further aspect, one inventive aspect provides the use of a device according to certain embodiments, for performing 3D track monitoring of moving objects.

In a further aspect, one inventive aspect provides the use of a device according to certain embodiments, for performing movement control, e.g. automated movement control in surgical operations.

In a further aspect, one inventive aspect provides the use of a device according to certain embodiments, for detecting strain effects in chip packaging processes.

In a further aspect, one inventive aspect provides the use of a device according to certain embodiments, for detecting magnetic labels used in biotechnology applications.

One inventive aspect also provides a magnetic field sensor device, comprising a measuring element comprising a semiconductor material, a means for providing current through said measuring element, said current flowing along a path between a first set of 2 contacts, positioned on opposed edges of said element, a means for measuring voltage over a second set of 2 contacts, positioned on opposed edges of said measuring element, each of said second set of 2 contacts being located on different or opposite sides of said path, characterized in that it further comprises a means for electrically isolating different predetermined areas of said element, being such that said first set of contacts can be electrically isolated from said second set of contacts.

Features of this device may be as set out above with regard to any of the previous embodiments.

One inventive aspect furthermore provides a magnetic field mapping device, characterized in that it comprises an array with a plurality of integrated Hall sensors and transistors interconnected by electrodes and further comprising a control means to make the Hall sensors individually addressable to have the response signal in each discrete Hall sensor to a locally present magnetic field perceptible. The array may be a two-dimensional array system.

According to certain embodiments, the transistors, Hall sensors and interconnecting electrodes may be integrated in a single chip device.

According to certain embodiments, each Hall sensor may be addressable without loss of sensitivity compared to a discrete Hall sensor in the same material.

According to certain embodiments, the transistors may comprise a gate dielectric. This gate dielectric prevents leakage currents from flowing through the gate and enhances the gate breakdown voltage.

According to certain embodiments, the transistors may be semiconductor transistors. The transistors may for example be n-channel depletion mode transistors.

According to certain embodiments, the Hall sensors may comprise semiconductor material.

According to certain embodiments, the array system may be coated by a fluid comprising magnetic nano- or micro structures. The array system may be coated by a fluid comprising paramagnetic molecules. The array system may alternatively be coated by an elastic magnetic film comprising a component of the group consisting of a magnetic film, magnetic nanostructure, magnetic microstructures and paramagnetic molecules.

A device according to certain embodiments may be used for magnetic field imaging.

A device according to certain embodiments may be used for detecting spatially varying and time-dependent magnetic fields.

A device according to certain embodiments may be used for high-precision positioning and magnetic field detection and imaging of variations in time or in space.

A device according to certain embodiments may be used for high-resolution two-dimensional and three-dimensional imaging of magnetic fields, particularly for Scanning Hall Probe Microscopy.

DETAILED DESCRIPTION OF CERTAIN INVENTIVE EMBODIMENTS

Figure 1:
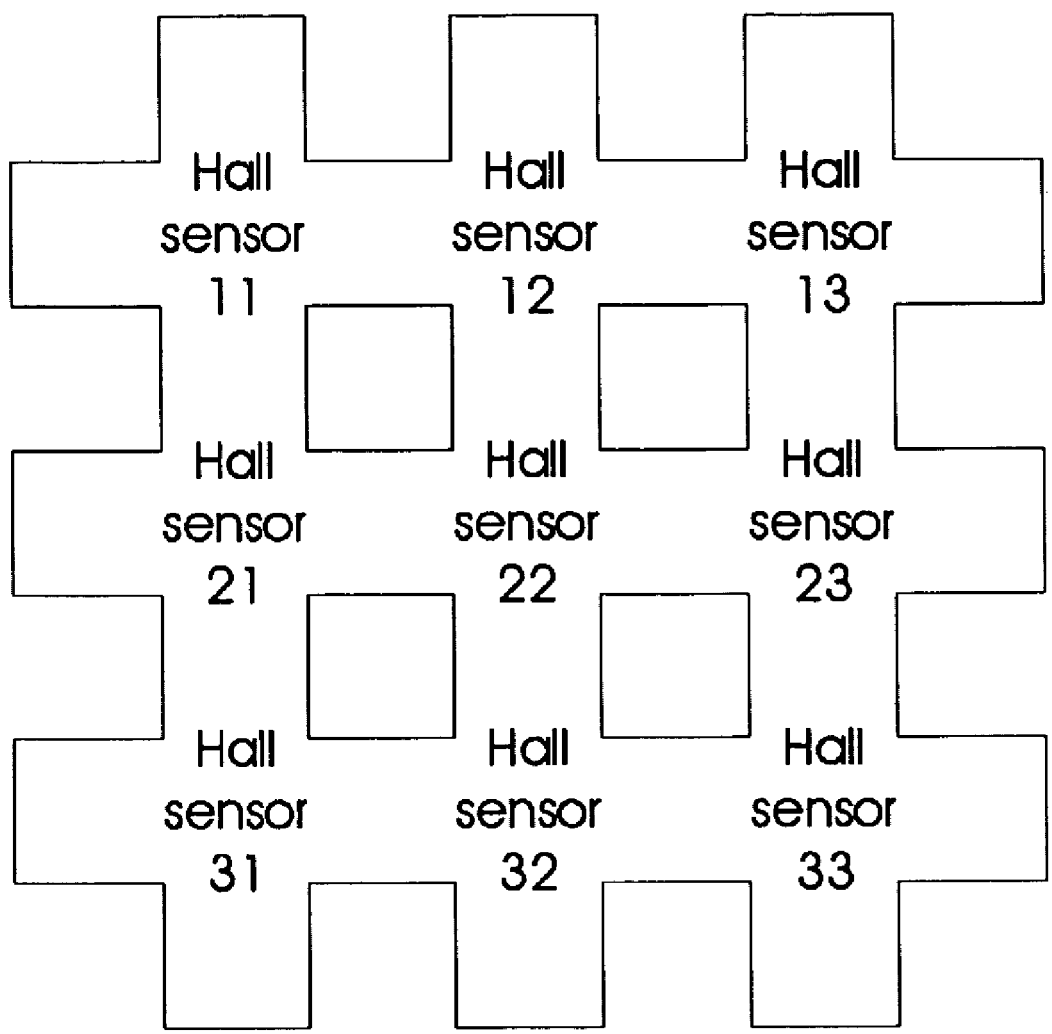
FIG. 1 is a schematic view of a prior art 3×3 interconnected Hall sensor array. All currents and Hall voltages are intermixed and read-out of each sensor individually is impossible.

A straightforward implementation of a two-dimensional array of interconnected Hall sensors (FIG. 1) results in a strongly coupled system and the responses from individual Hall sensors are totally intermixed for both currents and Hall voltages.

A successful design of a true two-dimensional array of independent Hall sensors is obtainable by solving the problem of addressing and reading out in a controlled way individually each Hall sensor forming the two-dimensional array. In a preferred embodiment switches (as e.g. transistors) and Hall sensors are combined in a two-dimensional array in an integrated and very compact way, thus making it possible to address each sensor individually without loss of sensitivity. With the proposed design we have successfully built and tested a device clearly demonstrating the operations of this approach.

The following is a detailed description of certain embodiments referring to the accompanying drawings. It is intended that the specification and examples be considered as exemplary only. Other embodiments will be apparent to those skilled in the art from consideration of the specification and practice of embodiments disclosed herein.

Figure 2A:
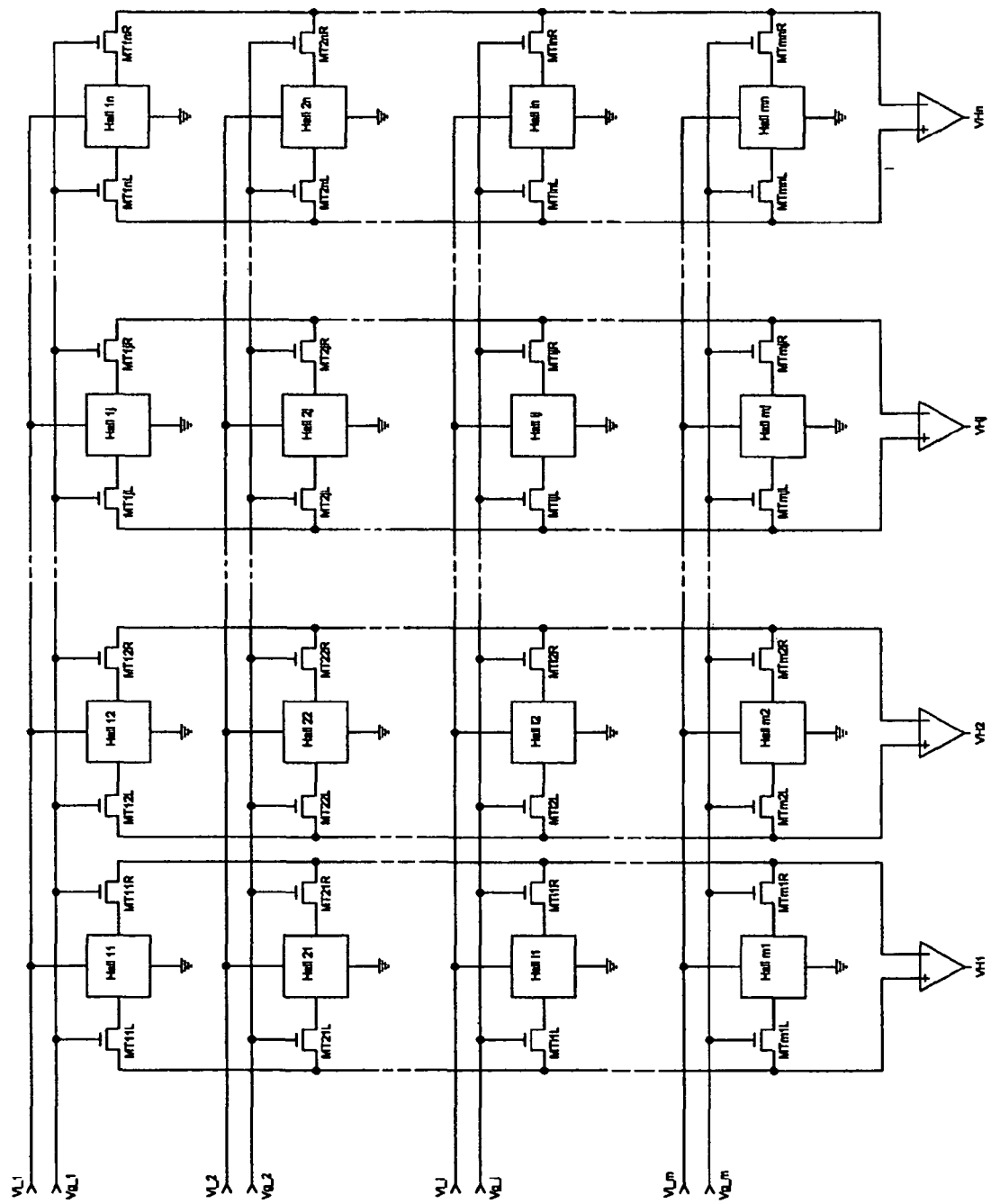
FIG. 2a. demonstrates the architecture of the two-dimensional m×n Hall sensor array according to an embodiment.
Figure 2B:
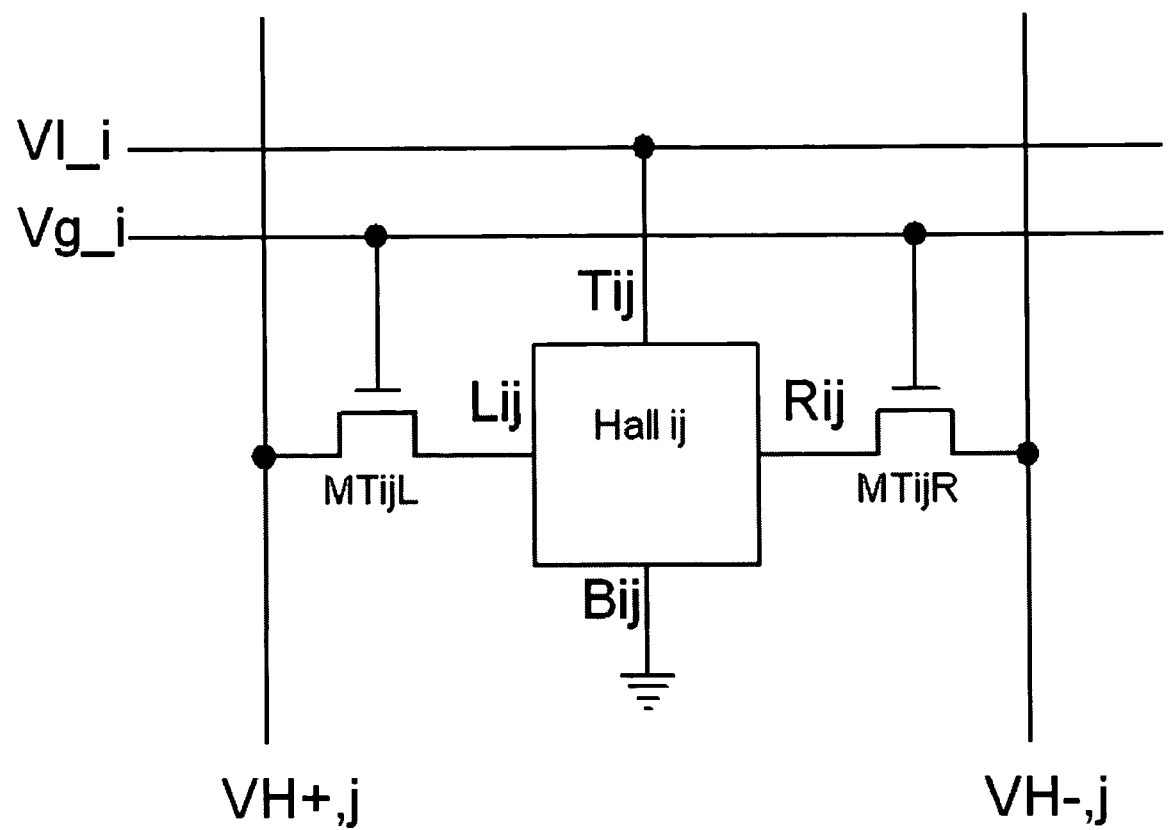
FIG. 2b is a close-up of one cell (i,j) according to an embodiment, showing the name conventions used in the text.

Referring now specifically to the drawings, the architecture of the proposed two-dimensional array of Hall sensors according to a first embodiment is illustrated in FIGS. 2a and 2b. In general, the array is a two-dimensional matrix of m×n Hall sensors, m and n being the number of rows and columns respectively. m and n can take any value within the natural numbers. The Hall sensor in row number i and column number j is referred to as "Hall sensor (i,j)". Each Hall sensor has four contacts, referred to as "Tij", "Bij", "Lij" and "Rij" respectively (see FIG. 2b).

The Tij contacts of all n Hall sensors in each row i (i=1 ... m) are electrically connected in parallel by the electrode named "VI_i". Also the By contacts of all n Hall sensors in each row i (i=1 ... m) are electrically connected in parallel and are permanently grounded.

Each Hall sensor (i,j) is flanked by two switches, preferably transistors, more preferably MOS transistors, one from the left (MTijL) and one from the right (MTijR). For each sensor (i,j), the source contacts of transistors MTijL and MTijR are connected to its Lij and Rij contact respectively. The Lij and Rij contacts are also called "read-out contacts". The drain contacts of all m MTijL transistors (i=1 ... m) in each column j (I=1 ... n) are electrically connected in parallel by the electrode named "VH+,j". Also the drain contacts of all m MTijR transistors (i=1 ... m) in each column are electrically connected in parallel by the electrode named "VH−,j". VH+,j and VH−,j go to a differential amplifier that reads out VHj=VH+,j−VH−,j. The VH+,j and VH−,j electrodes are also called the "read-out leads".

The gate contacts of all 2n MTijL and MTijR transistors (j=1 ... n) in each row i (i=1 ... m) are electrically connected in parallel by the electrode named "Vg_i".

In this architecture, each row i has both a VI_i electrode and a gate electrode Vg_i. Each column j has two read-out electrodes, VH+,j and VH−,j, going to a differential amplifier reading out VHj. This amplifier can be either integrated on the same chip, or can be external to the chip on which the 2D Hall sensor array is processed. All m×n By (i=1 ... m; j=1 ... n) contacts are connected to ground. An m×n array thus has 2*(m+n)+1 electrodes. The number of electrodes is thus proportional to the dimension of the matrix and not to the square of the dimension, which would be the case if each Hall sensor would be addressed by a separate set of electrical leads.

Figure 3:
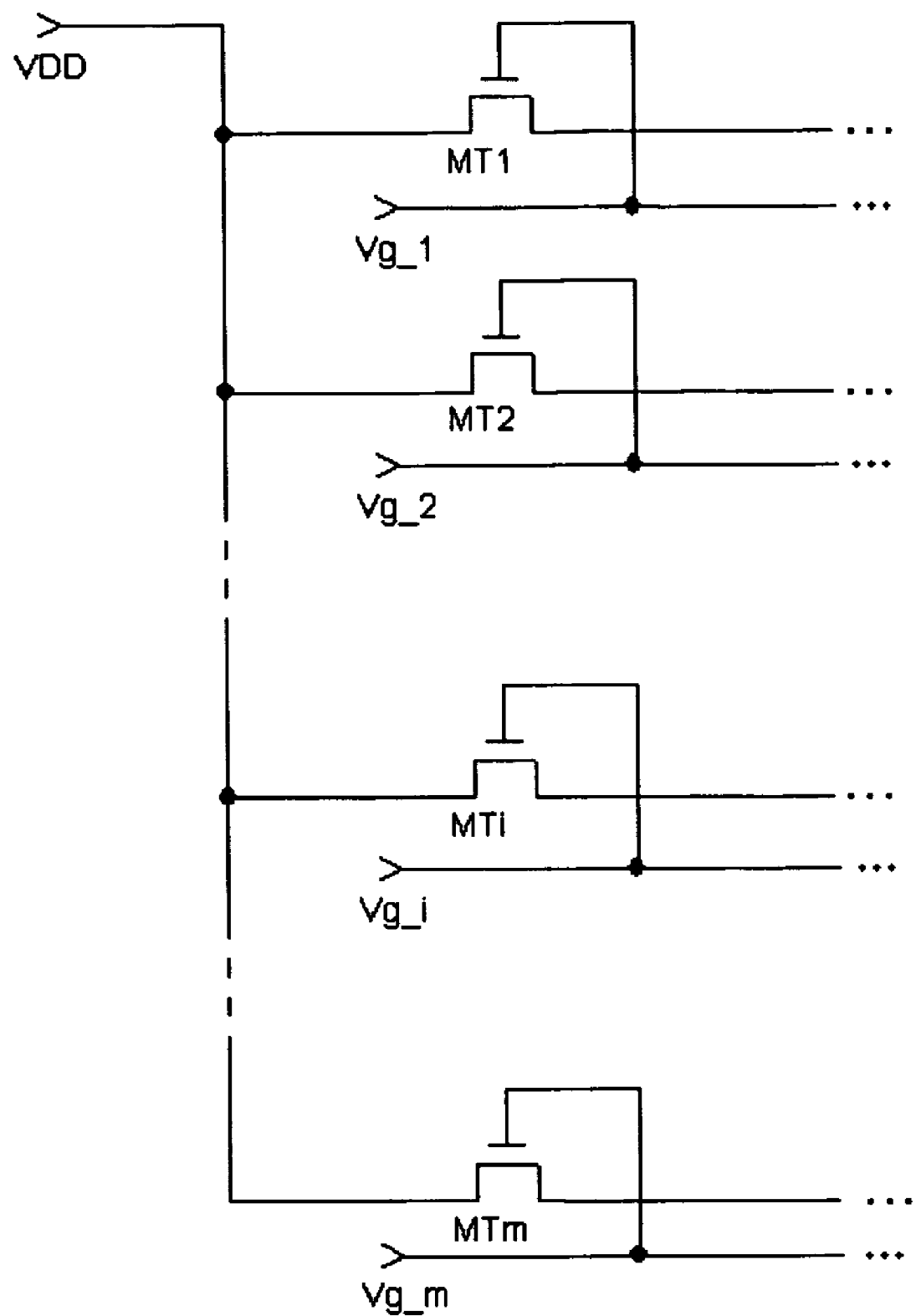
FIG. 3 is an extension of the basic architecture that allows to further reduce the number of contacts of an m×n Hall sensor array to m+2n+2 according to an embodiment.

The number of contacts can be further reduced by connecting all VI_i contacts and connecting them to the source voltage VDD as shown in FIG. 3. Each VI_i line has a switch (preferably a MOS transistor) MTi that is automatically opened when the gate voltage on the electrode Vg_i<VT.

Figure 19:
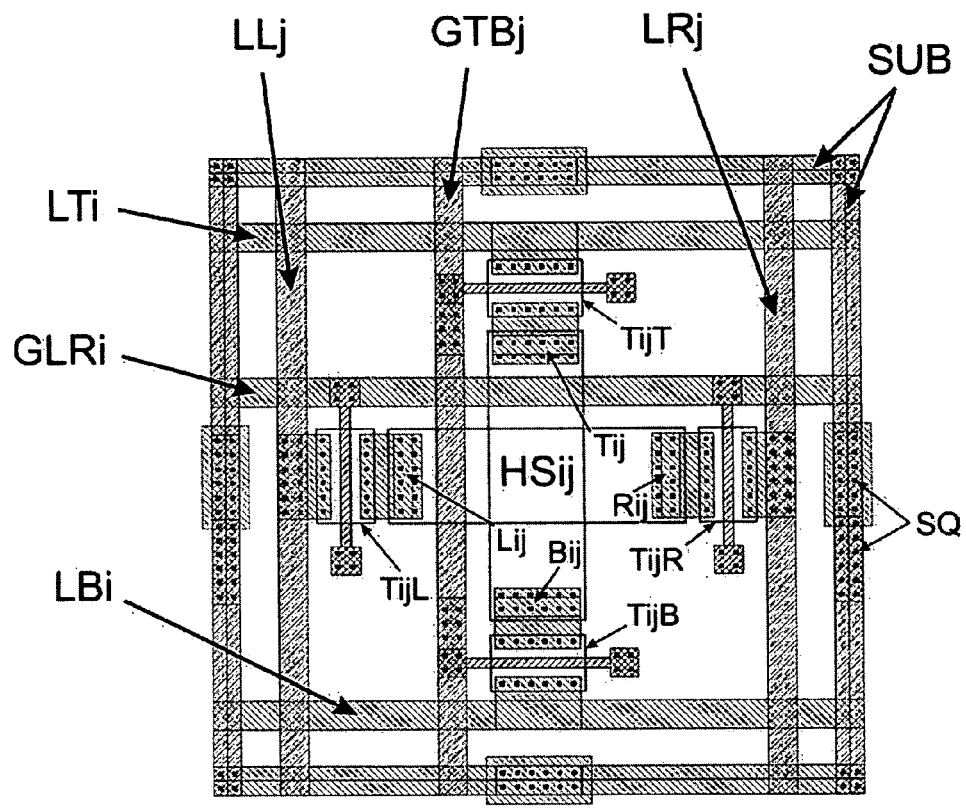
FIG. 19 is a schematic view of an embodiment of a single Hall sensor cell. The name convention for the different parts is indicated. The shown lay-out is typical for a CMOS technology in silicon.

Another embodiment is shown in FIG. 19, in which a single Hall sensor cell is shown. The squares SQ indicate electrical contacts between overlapping layers. In this embodiment Hall sensor HSij is flanked by four switches (preferably enhancement mode MOS transistors) TijL, TijR, TijT and TijB. In the subsequent description the switches are assumed to be enhancement mode MOS transistors. The drain contacts of these transistors are connected to the Lij, Rij, Tij and Bij contacts of Hall sensor HSij respectively. The source contacts of transistors TijL and TijR are connected to the electrical lines LLj and LRj respectively, and this for every column j (j=1 ... n). The source contacts of transistors TijT and TijB are connected to the electrical lines LTi and LBi respectively, and this for every row i (i=1 ... m). The gates of transistors TijL and TijR are connected to the electrical line GLRi and the gates of transistors TijT and TijB are connected to the electrical line GTBj. The SUB contacts serve for electrical contact to the substrate, such that it can be biased to a reference potential.

Figure 20:
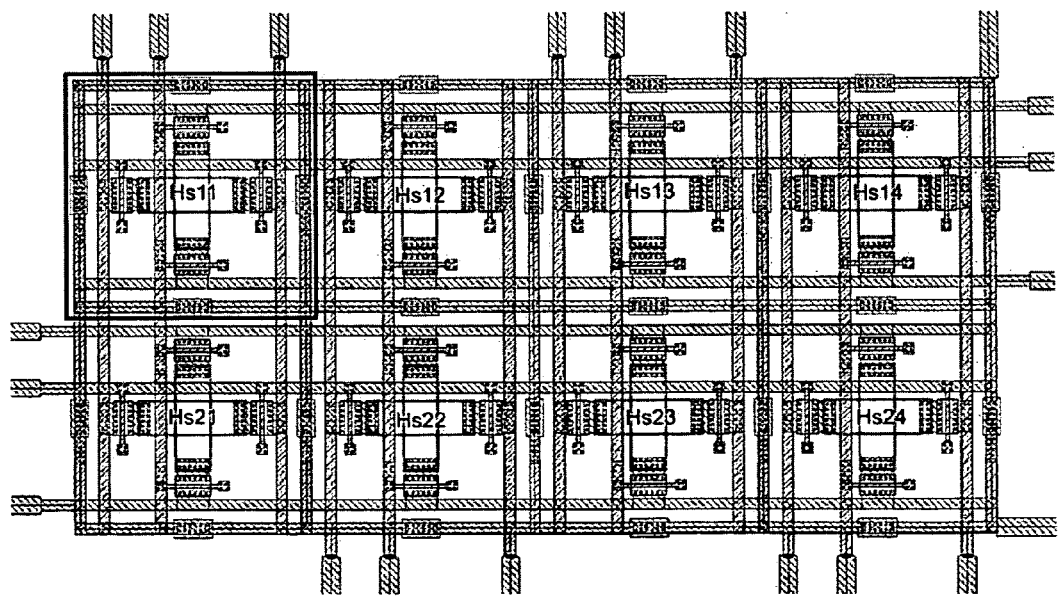
FIG. 20 is a schematic view of a 2×4 array of Hall sensor cells. A detailed view of a single Hall sensor cell is shown in FIG. 19.

The cell of FIG. 19 can be repeated in a 2D array as shown in FIG. 20, which shows a 2×4 array, i.e. m=2 and n=4 in the above notation. The black square indicates one single cell in the array that is shown in detail in FIG. 19. In this embodiment each row has 3 electrical contacts, each column has 3 electrical contacts and there is one SUB contact. Therefore a m×n Hall sensor array has 3*(n+m)+1 electrical contacts.

The advantage of the architecture of this embodiment is that it is completely symmetric in rows and columns. It hence allows for interchanging the role of rows and columns, which has proven useful for e.g. offset compensating read-out techniques, as described later.

Another embodiment can be derived from the previous embodiment by splitting the GTBj line into two separate lines GTj and GBj, such that GTj connects the gate contacts of all m transistors TijT in column j, and GBj connects the gate contacts of all m transistors TijB in column j, and this for every column j (j=1 ... n). Similarly, the GLRi line may be split into two separate lines GLi and GRi, such that GLi connects the gate contacts of all n transistors TijL in row i, and GRi connects the gate contacts of all n transistors TijR in row i, and this for every row i (i=1 ... m). In this embodiment each gate contact of a given sensor cell HSij can be addressed separately. In this embodiment each row has 4 electrical contacts, each column has 4 electrical contacts and there is one SUB contact. Therefore a m×n Hall sensor array has 4*(n+ m)+1 electrical contacts. The architecture of this embodiment is also completely symmetric in rows and columns. The advantage of this architecture is the possibility to independently vary the gate voltage of transistors TijL, TijR, TijT and TijB, and thus e.g. compensate for differences in their characteristics.

EXAMPLES

Example 1

Working Principle

Semiconductor Material

The Hall sensors and switches are made from semiconductor material. This can be silicon, GaAs, InAs, InSb or an epitaxially grown III-V (or other) semiconductor heterostructure in which the heterojunction is made between a low band gap and a high band gap material such as GaAs/AlGaAs or GaN/AlGaN. In the case of semiconductor heterostructures, charge carriers (electrons) are provided to the semiconductor by a delta-doping layer (e.g. Si) in the case of GaAs/AlGaAs and by piezoelectric charges induced by the strained pseudomorphic epitaxy of AlGaN on GaN in the case of GaN/AlGaN. The electric fields inside the semiconductor induce a band bending which results in the formation of a quantum well at the heterojunction. The electrons are trapped in this quantum well and form a two-dimensional electron gas (2DEG) with high mobility at the position of the heterojunction. Mobilities in GaAs/AlGaAs range from more than $10^4$ $cm^2/Vs$ at room temperature to more than $10^6$ $cm^2/Vs$ at liquid helium temperatures.

Hall Effect

Sending a current through one Hall sensor from its Tij electrode to its Bij electrode generates a voltage between its Lij and Rij electrodes, which is proportional to the vertical component of the magnetic induction through the centre of the Hall sensor. State-of-the-art Hall sensors have sensitivities in the order of 0.2 Ω/Gauss and can detect magnetic fields as small as 0.1 Gauss at room temperature down to less than $10^{-3}$ Gauss at cryogenic temperatures (from 0K to 10K (liquid helium temperatures) or from 50K to 150K (liquid nitrogen temperatures)).

(a) Switches

The switches are preferably semiconductor transistors, e.g. MOS transistors, preferably n-channel or p-channel depletion or enhancement mode transistors. In the case of GaAs/AlGaAs or GaN/AlGaN or other semiconductor heterostructures, they are called High Mobility Transistors (HMTs) and in the case of n-channel transistors they are High Electron Mobility Transistors (HEMTs). In the case of bulk Si, GaAs or other semiconductors, they are preferably Metal-Oxide-Semiconductor Field Effect Transistors (MOSFETs). These transistors can contain a gate dielectric, preferably $Al_2O_3$ or $SiO_2$.

A depletion mode transistor is normally on, i.e. when the gate is grounded the channel is electrically conducting. It is turned off, i.e. the channel resistance is made infinite, by applying a gate voltage larger than the threshold voltage $V_T$, which can be negative or positive. An enhancement mode transistor is normally off, i.e. when the gate is grounded the channel resistance is infinite, and is turned on, i.e. the channel is made conducting, by applying a gate voltage larger than the threshold voltage $V_T$, which can be negative or positive.

The gate oxide prevents leakage currents from flowing through the gate and drastically enhances the gate breakdown voltage.

These transistors can be processed from the same material as the Hall sensors and can thus be integrated in a single-chip device. The high mobility of the 2DEG in the channel of HEMTs makes them suitable for high frequency operation.

The switches may also be realized with other kinds of transistors such as bipolar transistors. Also for example diodes (pn junctions) may be used as switches.

Combining a Hall Sensor and Switches in a Novel Hybrid Device

In the subsequent description the switches will be assumed to be MOS or HEMT transistors.

We present a novel way of integrating the MTijL and MTijR transistors and one or more Hall sensors (i,j) into a new hybrid device. This hybrid device forms a single cell which can be integrated in an on-chip two-dimensional array of individually addressable magnetic field sensors.

Figure 4:
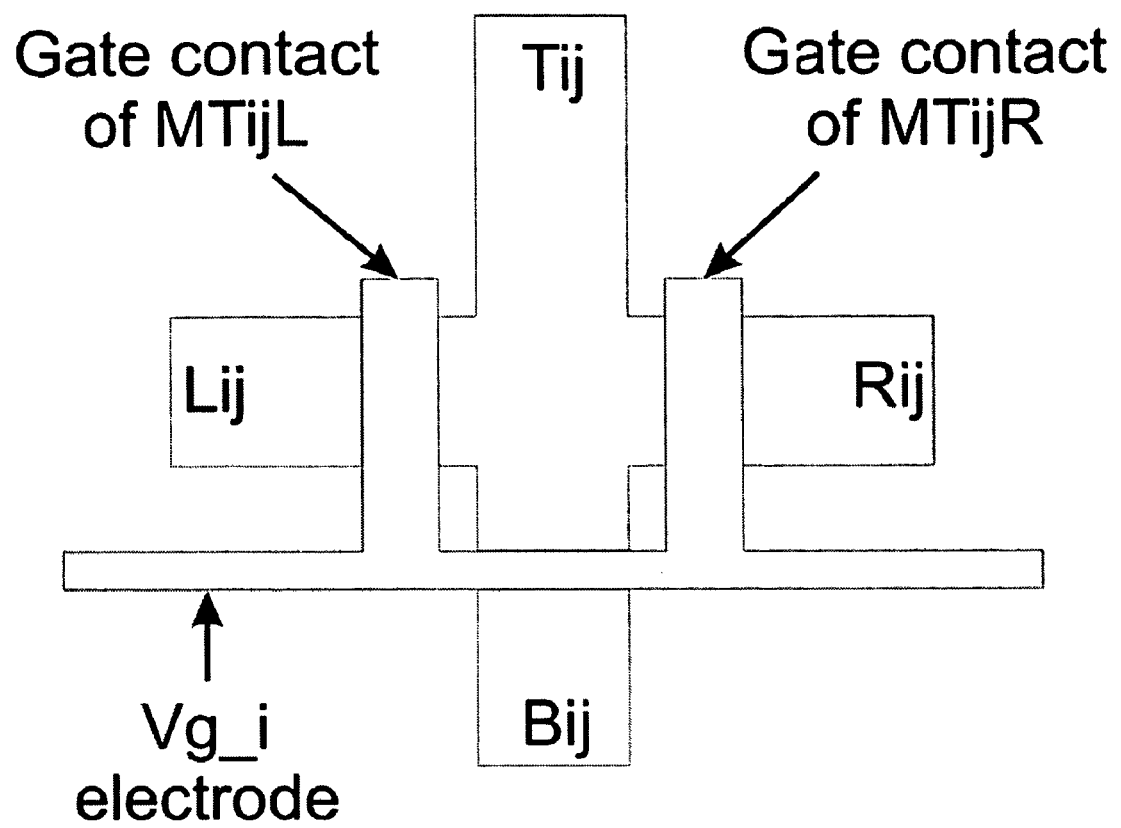
FIG. 4 shows how transistors can be integrated in a cross-shaped Hall sensor according to an embodiment.

In a preferred embodiment, a Hall sensor (i,j) has the shape of a cross, as shown in FIG. 4. The transistors MTijL and MTijR are integrated in the Hall sensor as follows. Part of the left arm serves as the channel for transistor MTijL. Over this part the gate contact of MTijL is placed. The Lij contact of the Hall sensor can then be defined as the drain contact of MTijL, whereas both the Tij and Bij contacts can be defined as the source contacts of MTijL. In an analogue way, part of the right arm serves as the channel for transistor MTijR. Over this part the gate contact of MTijR is placed. The Rij contact of the Hall sensor can then be defined as the drain contact of MTijR, whereas both the Tij and Bij contacts can be defined as the source contacts of MTijR.

Figure 5A:
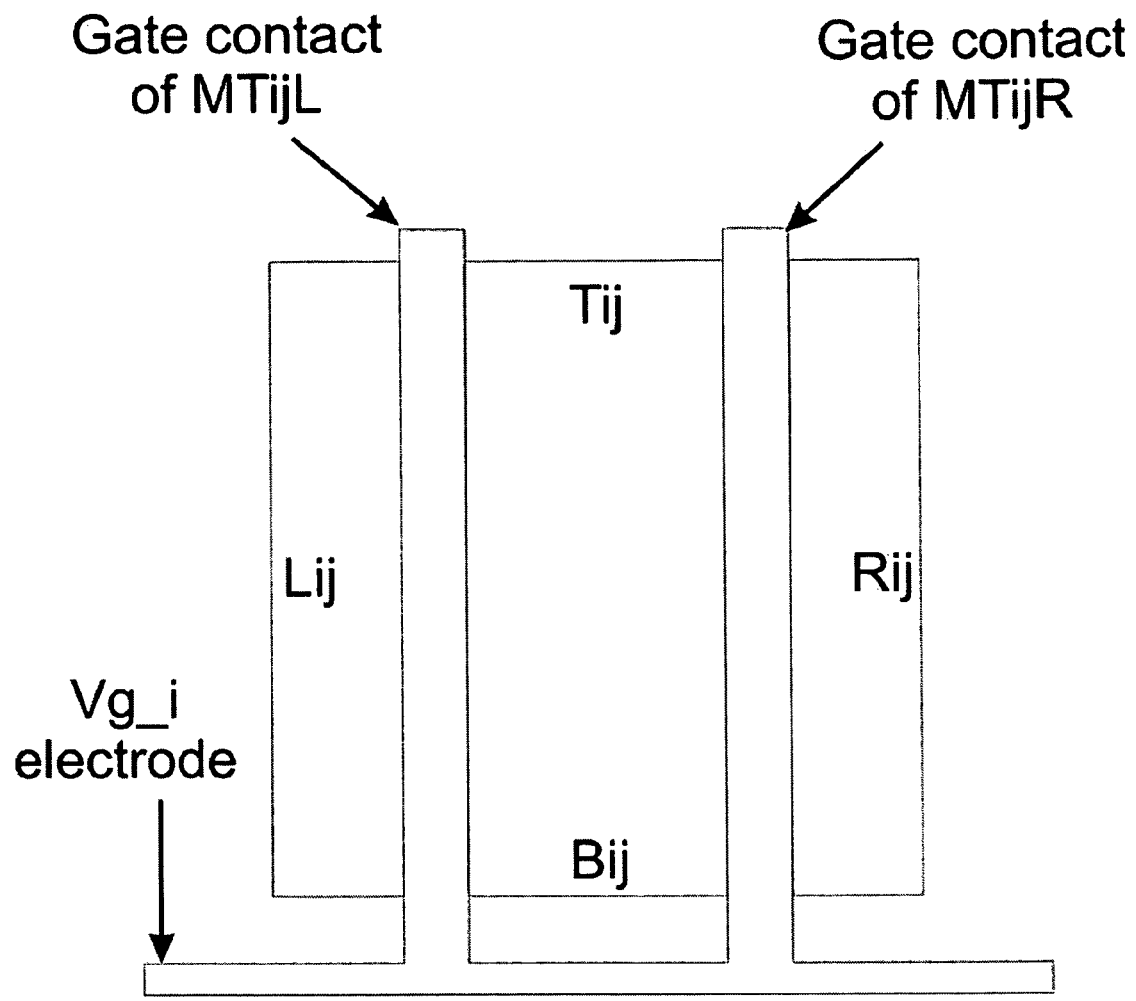
FIG. 5a shows how transistors can be integrated in a square shaped Hall sensor with the gate electrodes of the transistors parallel to the edges of the square, according to an embodiment.

In another embodiment the Hall sensor has the shape of a square with the Tij, Bij, Lij and Rij contacts and the gates of the MTijL and MTijR transistors placed as indicated in FIG. 5a. This can be extended to an embodiment in which the Hall sensor has the shape of a rectangle in which the distance between the Tij and Bij contacts is larger than the distance between the Lij and Rij contacts or vice versa.

Figure 5B:
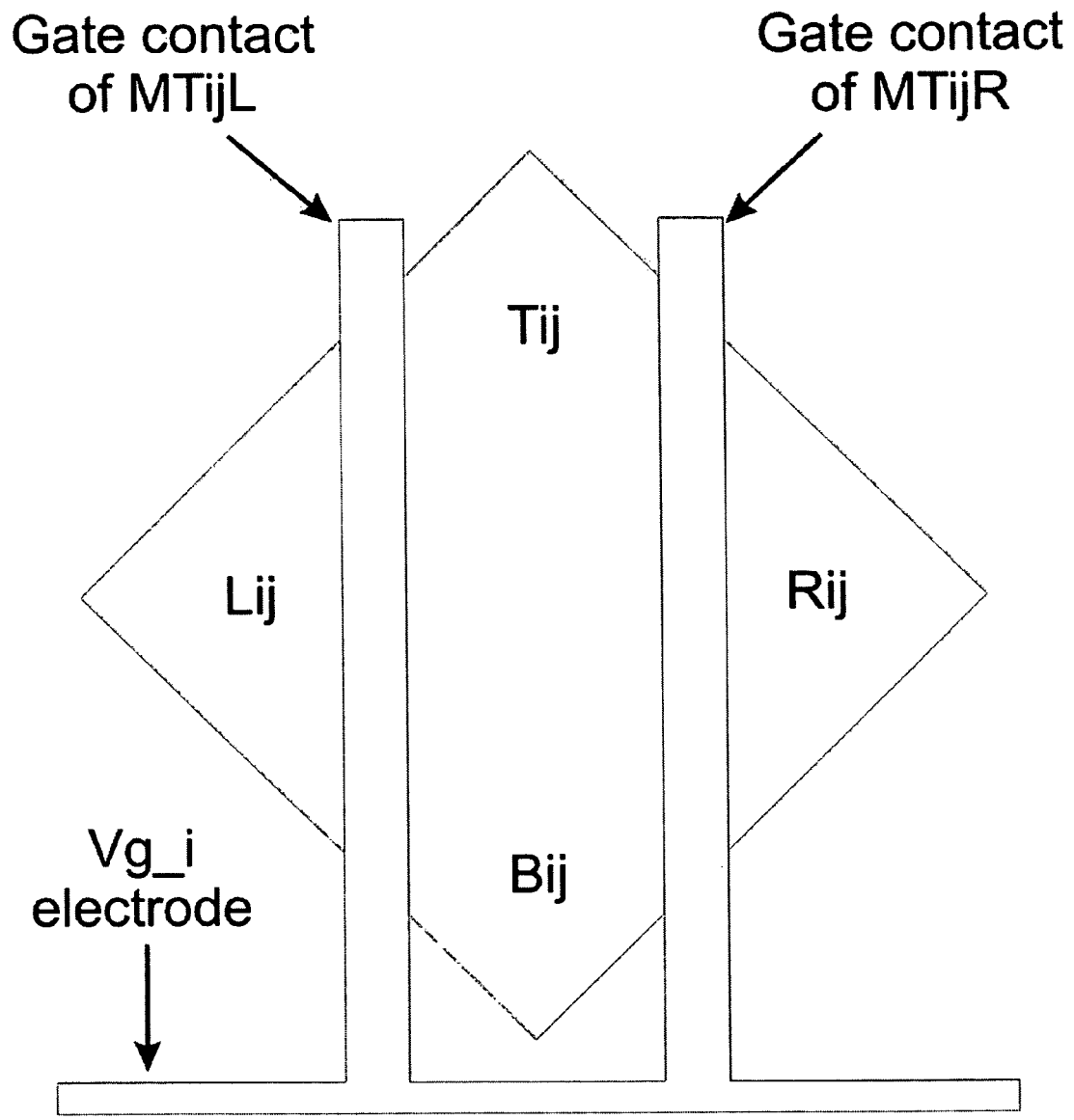
FIG. 5b shows how transistors can be integrated in a square Hall sensor with the gate electrodes of the transistors parallel to a diagonal of the square, according to an embodiment.

In yet another embodiment the Hall sensor has the shape of a square with the Tij, Bij, Lij and Rij contacts and the gates of the MTijL and MTijR transistors placed as indicated in FIG. 5b.

Figure 6:
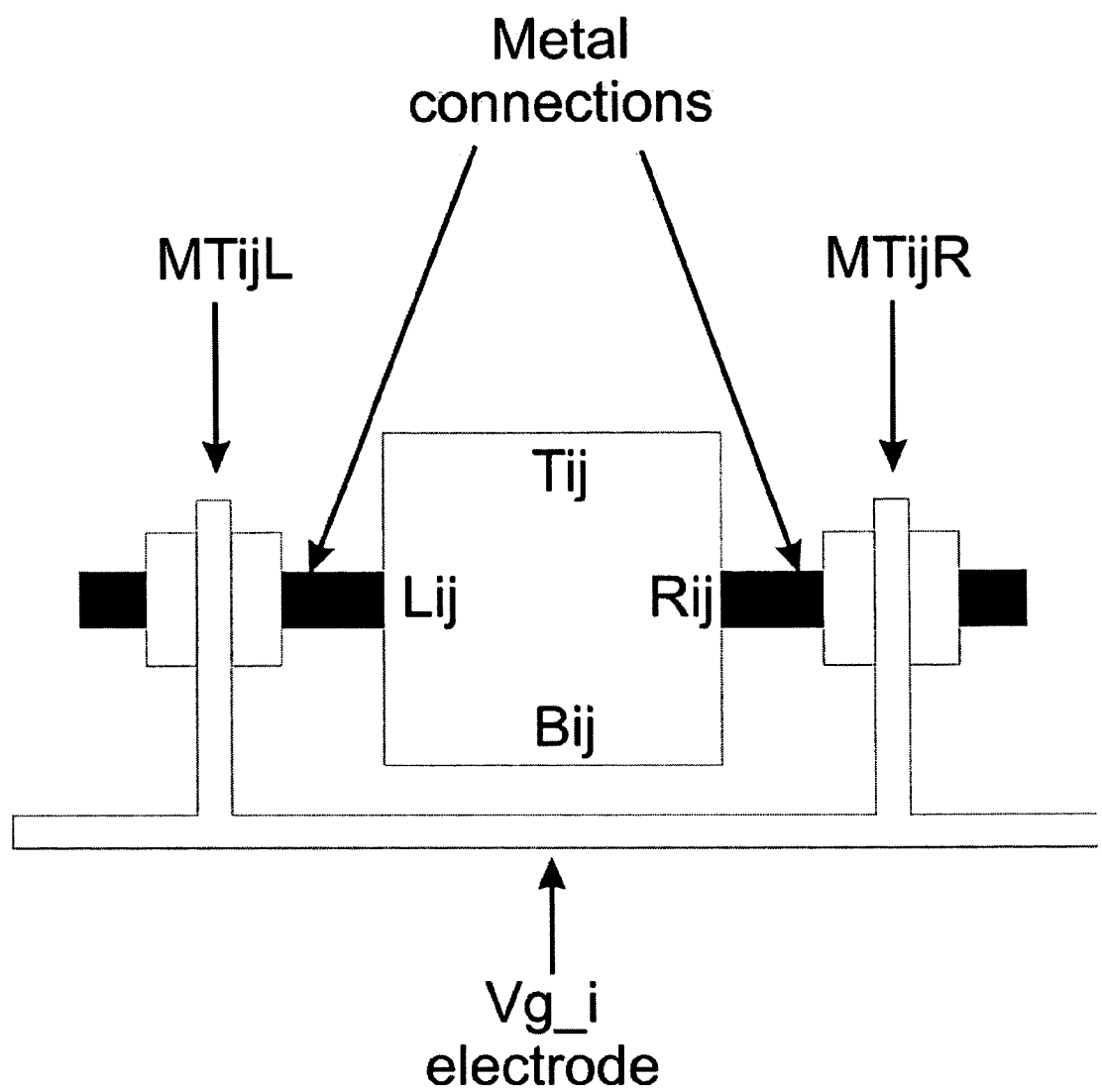
FIG. 6 shows a combination of a Hall sensor with transistors in which the transistors lie in line with the Lij and Rij electrodes and are not part of the Hall sensor, according to an embodiment.

In another embodiment the channels of the MTijL and MTijR transistors lie in line with the read-out contacts Lij and Rij of the Hall sensor, but their channels are not a part of the Hall sensor. The Lij and Rij contacts are electrically connected to the drain contacts of MTijL and MTijR respectively by e.g. a metal as shown in FIG. 6. This embodiment can be realized in combination with any of the different shapes described in FIGS. 4 and 5.

In another embodiment, referring to FIG. 19, four transistors TijL, TijR, TijT and TijB lie in line with the Hall sensor contacts Lij, Rij, Tij and Bij, as explained above. Their channels are not part of the Hall sensor. The drain contacts of these transistors are connected to the Lij, Rij, Tij and Bij contacts of Hall sensor HSij respectively.

All different embodiments described above may be realized in a variety of different semiconductor materials, such as GaAs, GaN, Si, InAs, GaSb, organic semiconductors, heterostructures such as GaAs/AlGaAs, GaN/AlGaN etc. The list of materials mentioned here is not restrictive to certain embodiments.

The hybrid devices (or Hall sensor cells) HS(i,j), integrating Hall sensor (i,j) and transistors MTijL and MTijR or transistors TijL, TijR, TijT and TijB, described by the embodiments above, are then integrated into a 2D array as described higher, in reference to FIGS. 2a and 20.

Reading Out the Two-Dimensional Hall Sensor Array

In the embodiment of FIG. 2a, reading out an individual Hall sensor in row i and column j involves selectively sending current through all sensors in row i in parallel. In each column, the sensor through which current is sent is referred to as the "active Hall sensor" and the other sensors in the same column are referred to as the "passive Hall sensors". A row including an active Hall sensor is called an active row. A row including only passive Hall sensors is called a passive row. Therefore there is always one active row and there are m−1 passive rows.

Each active Hall sensor generates a Hall voltage, which is proportional to the magnetic induction through that particular sensor. In order to prevent shunt currents through the passive sensors which are parallel to the active sensor in each column, all passive sensor shunt paths are blocked by setting the transistors of each passive row to the off-state by applying a suitable gate voltage to all passive rows. In case of n-channel MOS or HEMT transistors, this means $VGG<V_T$, in case of p-channel MOS or HMT transistors, this means $VGG>V_T$. In this configuration, no current can flow between the Lij and Rij contacts of the active Hall sensor in a particular column and it therefore acts as an individual Hall sensor without loss of sensitivity. This unaltered Hall voltage can then be read out.

The procedure for reading out Hall sensor (i,j) is thus preferably (also see FIG. 2a):

Ground the Bij electrodes of all m×n sensors in the array.
Set VI_k=GND for all k≠i
Set Vg_k=VGG<VT for all k≠i
Set Vg_i=GND
Set VI_i=VDD
Read the differential voltage VHj=VH+,j−VH−,j In the embodiment of FIGS. 19 and 20, reading out an individual Hall sensor HSij in row i and column j involves selectively sending current through that particular sensor HSij. The sensor through which current is sent is referred to as the "active Hall sensor". If we assume that the transistors are n-channel enhancement mode transistors, i.e. their threshold voltage $V_T>0$, reading out Hall sensor HSij in the Hall sensor array is preferably done in the following way:

Ground the SUB contact
Ground the lines GLRk and GTBl for which k≠i and l≠j
Apply a voltage VGG>VT to lines GLRi and GTBj
Apply a current between the lines LTi and LBi
Measure the Hall voltage between the lines LLj and LRj Since the architecture of this embodiment is completely symmetric in rows and columns, the two last steps can be interchanged, i.e. a current can be applied between the lines LLj and LRj and the Hall voltage can be measured between the lines LTi and LBi. This allows for e.g. offset-reducing techniques to be used by sending current through the Hall sensor in different directions. This offset reduction may be performed in the following way. In a first phase of the measurement a current is applied between the lines LTi and LBi of Hall sensor HSij and the Hall voltage is measured between the lines LLj and LRj. The measured voltage $V_{out,1}$ will be the sum of the useful Hall voltage $V_H$ and an offset voltage $V_{offset}$, i.e. $V_{out,1}=V_H+V_{offset}$. In a second phase of the measurement all contacts are shifted clockwise by one contact, i.e. a current is applied between the lines LRi and LLi and the Hall voltage is measured between the lines LTj and LBj. The measured voltage $V_{out,2}$ will now be the sum of the useful Hall voltage $V_H$ and minus the offset voltage $V_{offset}$, i.e. $V_{out,2}=V_H-V_{offset}$. The useful Hall voltage $V_H$ can now be extracted by adding $V_{out,1}$ and $V_{out,2}$, i.e. $V_H=(V_{out,1}+V_{out,2})/2$. This method assumes that the magnitude of the offset voltage is the same in the two phases of the measurement. Usually several switching cycles are necessary in order to reduce the offset voltage.

This technique can be extended by shifting the contacts two more times by one contact, until the initial configuration of the first phase is again obtained. There are then four phases in the measurement cycle.

In the embodiment in which the GTBj line and GLRi lines are each split into two separate lines GTj and GBj, and GLi and GRi respectively, the voltages on each of the four gates can be tuned separately. This flexibility can be used to e.g. compensate for differences in characteristics in the different transistors.

In general, during a calibration procedure at the beginning of an actual measurement, the offset and background signals can be determined for each Hall sensor in the array. These signals can then be subtracted in the subsequent measurements.

Furthermore, an on-chip inductor can be integrated around the array, e.g. in the form of a conducting spiral, in order to generate a calibrated magnetic field by sending current through it, serving for calibration of the Hall sensor array.

Figure 22:
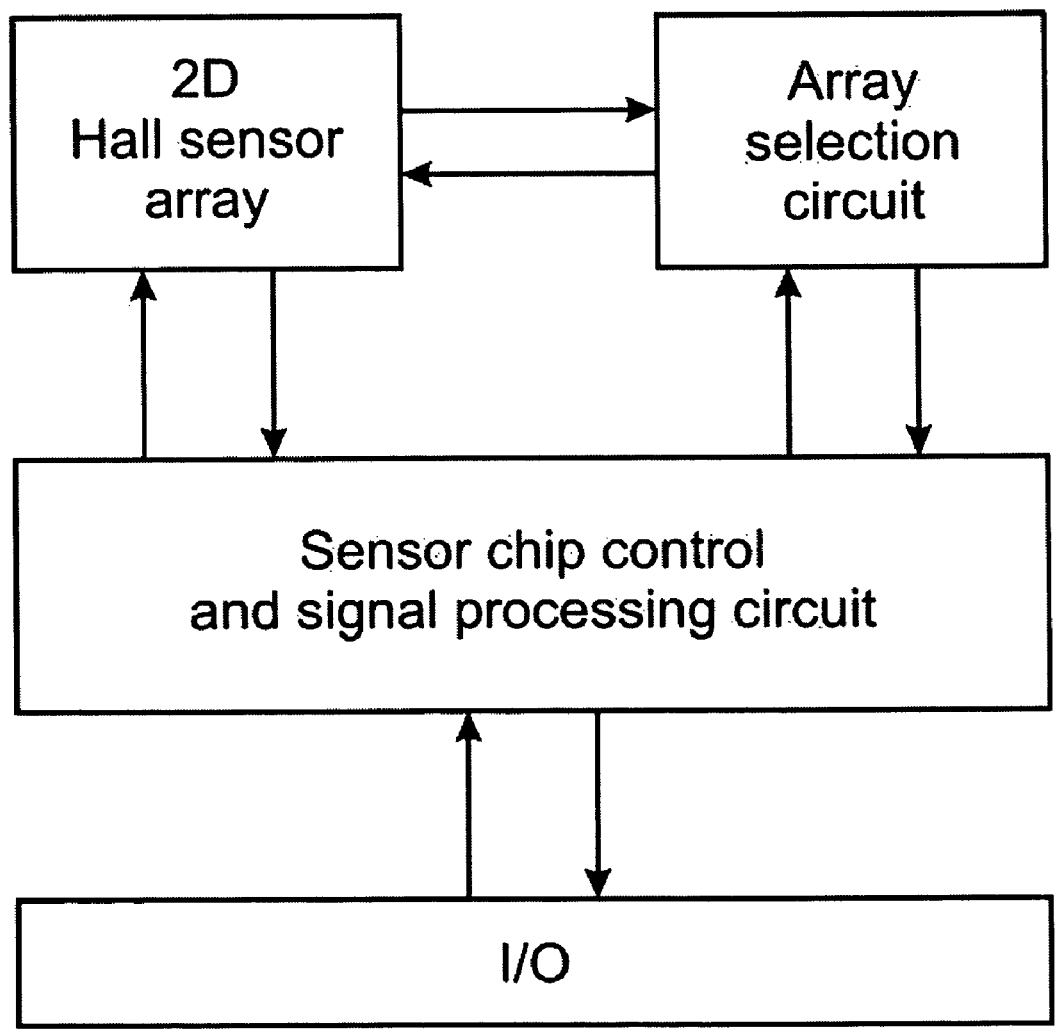
FIG. 22 is a schematic diagram of electronic circuitry that can be used to control and read out the 2D Hall sensor array.

Practically, the reading out for each embodiment of the 2D Hall sensor array can be performed by making use of conventional electronic components and circuitry. FIG. 22 shows a schematic diagram of how this can be done:

An array selection circuit selects the row i and column j of the Hall sensor HSij that has to be read out, as described above. This circuit can contain conventional electronic components such as multiplexers, counters etc.

A sensor chip control and signal processing circuit can provide reference potentials to both the 2D Hall sensor array directly and the array selection circuit. It can also provide clock signals, address signals etc. to the array selection circuit. The sensor chip control and signal processing unit can also process the signals coming from the 2D Hall sensor array either directly or through the array selection circuit. The signal processing can contain amplifiers, filters, signal conditioning circuitry, analog-to-digital converters etc. The sensor chip control and signal processing circuit can be linked to an input/output (I/O) interface, such as a computer.

The electronic circuits described above can be either integrated on the same chip as the 2D Hall sensor array, or can be (partially) external to the 2D Hall sensor array chip. Furthermore, software can be used in combination with the electronics in order to control the read-out of the 2D Hall sensor array. It will be apparent to those skilled in the art how such electronics can perform the read-out of the 2D Hall sensor array.

Example 2

Processing

The processing of these two-dimensional Hall sensor array devices takes place in a cleanroom equipped with lithography facilities. The subsequent processing steps are best done by optical or electron beam lithography, but any other appropriate technique might as well be used.

The compatibility of semiconductor (preferably GaAs/AlGaAs or silicon) switches (preferably HMT or MOS transistors) with Hall sensors in the same material allows for a straightforward process flow.

Figure 8:
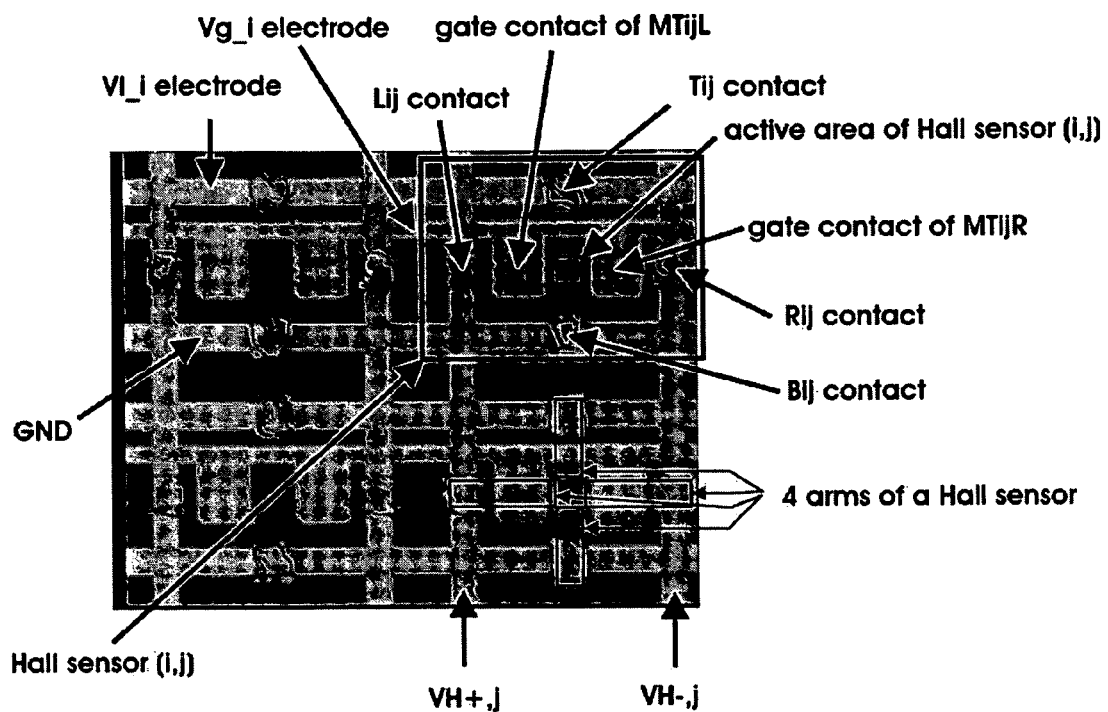
FIG. 8 displays an optical microscopy image of four neighbouring Hall sensors in a two-dimensional array, indicating the different parts of the Hall sensors corresponding to the notation convention used in the text and in FIGS. 2a and 2b.
Figure 21:
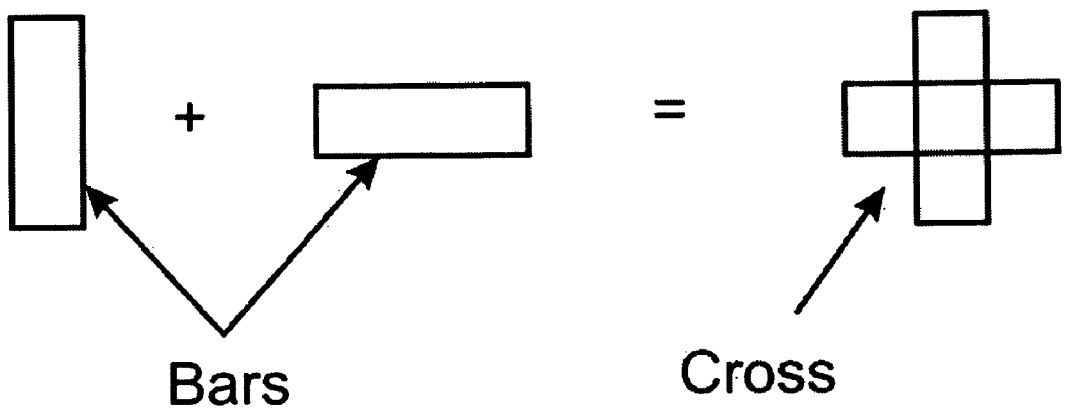
FIG. 21 shows the definition of a 'bar' and a 'cross'. Two intersecting, preferably substantially orthogonal, bars constitute one cross.

The Hall sensors are preferably cross-shaped. Geometrically, a cross is constructed by intersecting two orthogonal bars, as shown in FIG. 21. A cross has four arms, as indicated in FIG. 8. The terms 'bar' and 'arm' in the text are used according to these definitions. Making use of this cross-shape, we were able to develop a very compact design, using the left and right arm (corresponding to the Lij and Rij contacts respectively, see FIG. 8) of each Hall sensor (i,j) cross as MTijL and MTijR transistor respectively. This is achieved by positioning the gate electrode of MTijL and MTijR on top of the arm corresponding to contact Lij and Rij respectively of each sensor (i,j) (see FIG. 4). The transistors being integrated in the Hall sensor itself, they require no extra space and the Hall sensors can be placed as close together as lithographically possible, allowing for very dense sensor arrays. In this design it is possible to fabricate two-dimensional Hall sensor arrays with submicron array periods.

The process flow for a 2D Hall sensor array in GaAs/AlGaAs is preferably as follows:

Hall Sensor Mesa Etch

Figure 9:
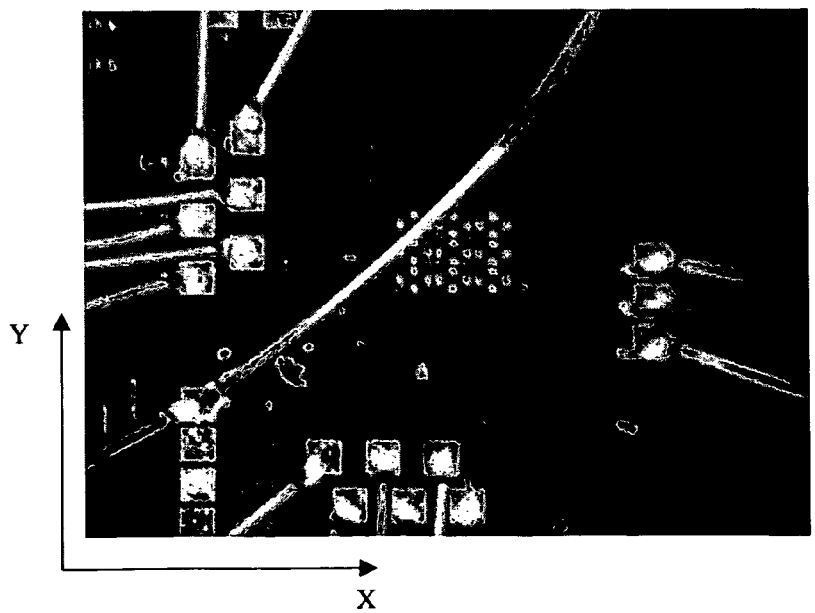
FIG. 9 displays a 3×3 Hall sensor array prototype, packaged and electrically bonded for testing. For an indication of the different parts, see FIG. 8. The convention of the X and Y axes is also shown.

The Hall sensor shapes are lithographically defined. In a preferred embodiment, these shapes are crosses, but they can also be squares, rectangles, star-shapes etc. Their sizes (being the width of their arms, sides of the square or rectangle, size of the star etc. respectively) are preferably in the range from 0.1 μm to 1000 μm, more preferably from 0.1 μm to 100 μm, most preferably from 0.1 μm to 10 μm. The size of one Hall sensor determines its spatial resolution, in the sense that the magnetic field it measures is the average magnetic field in its active area (see FIG. 8). The spacing between the Hall sensors, in X and Y direction (see FIG. 9), being the period of the Hall sensor array, i.e. the distance between the centres of two neighbouring Hall sensors, is preferably in the range from 0.1 μm to 5000 μm, more preferably from 0.1 μm to 100 μm, most preferably from 1 μm to 50 μm. The spacing between neighbouring Hall sensors also determines the spatial resolution of the 2D Hall sensor array, in the sense that when the array is statically read out, it measures the magnetic field at the positions where a Hall sensor is located.

An etch technique is then used to etch away all of the wafer except for the Hall sensor mesas and possible other active regions that need a conducting semiconductor channel, or that need to have a rough surface for easy bonding after the device is finished for example. Etch techniques can be wet, dry or other etch techniques.

Ohmic Contact Metallization

Figure 7:
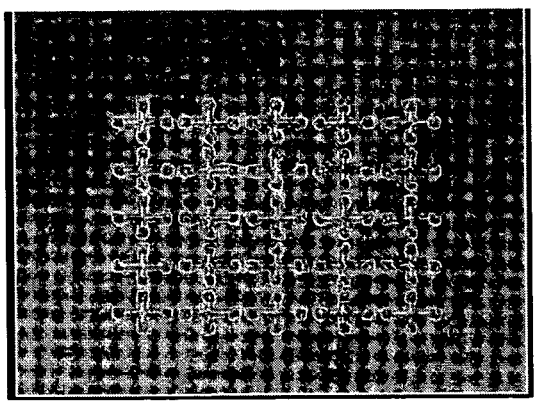
FIG. 7(a) to (d) displays optical microscopy images of a two-dimensional 5×5 Hall sensor array at different stages of the process flow. In this prototype design the spacing between two Hall sensors is 110 μm horizontally and 85 μm vertically. For an indication of the different parts, see FIG. 8.
Figure 7:
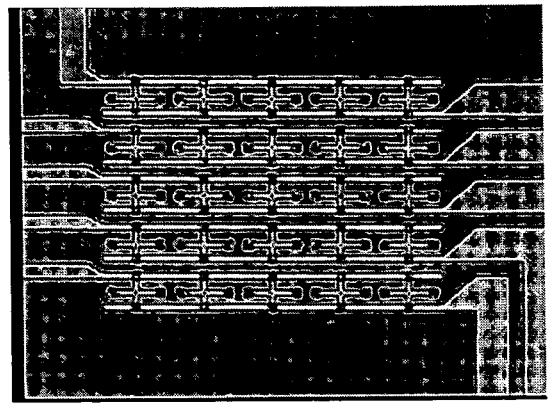
Figure 7:
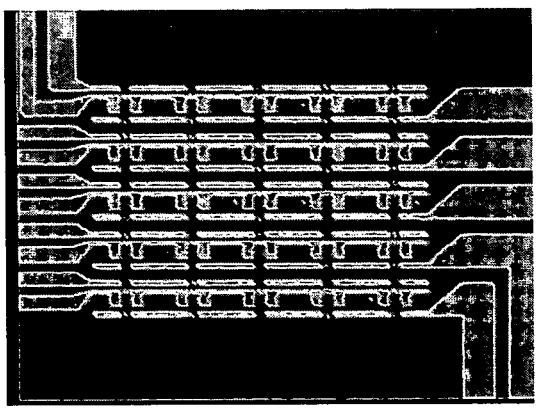
Figure 7:
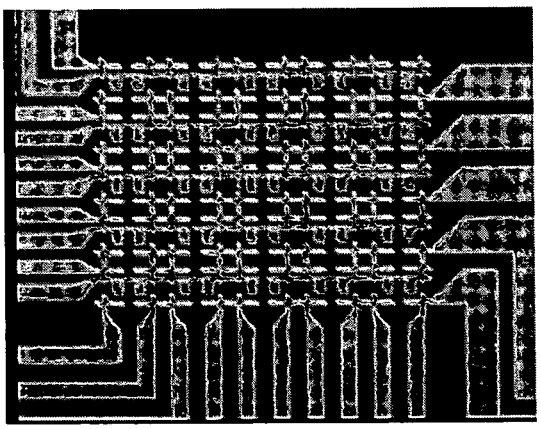

Ohmic contact regions are aligned to the mesas, as can be seen in FIG. 7a, (for notation convention, see FIG. 8). The ohmic contact regions include parts of the four arms of each Hall cross (i,j) mesa, defined as "Tij", "Bij", "Lij" and "Rij" contacts as shown in FIG. 8. The contact metallization is any appropriate material allowing to electrically contact the semiconductor channel. It is deposited by any deposition technique, including MBE, sputtering, thermal evaporation, etc.

The definition of the ohmic contact regions can be done using a lift-off technique, an etching technique, a shadow mask technique or any other appropriate technique.

The metallization can be a multilayer such as Ni/AuGe/Ni/Au providing an n-type contact to the 2DEG in the case of GaAs/AlGaAs. If needed, the ohmic contacts can be alloyed.

Current Leads Metallization

Current leads are the leads contacting the Tij and By electrodes of each Hall sensor as shown in FIG. 7b and FIG. 8. For each row i of Hall sensors, a current lead connects all Tij electrodes and another current lead connects all Bij electrodes (j=1 . . . n). They are aligned to the appropriate ohmic contacts. The deposition technique for the current leads can be the same as for the ohmic contact metallization. The metallization material is preferably Ti/Au, TiW/Au, Cu or Al but can be any other electrically conducting material.

Gate Dielectric Deposition

The gate dielectric is any dielectric, e.g. an oxide, electrically isolating the gate from the semiconductor from which the pass transistors and Hall sensors are made. Preferably $Al_2O_3$ or $SiO_2$ is used. The gate dielectric can be deposited by sputtering, evaporation, in situ oxidation or any appropriate technique. Its thickness is preferably in the range from 1 nm to 20 nm.

Gate Contact Metallization

The gate contacts can be aligned and deposited by the same technique as the current metallization. The gate contact metallization is any appropriate conducting material or combination of materials, including Au, Cr/Au, Ti/Au, Ni/Au, highly doped polysilicon, etc.

The gate contacts are positioned such that the gate electrodes of MTijL and MTijR cover part of the arms corresponding to contact Lij and Rij respectively of each cross-shaped Hall sensor (i,j) as shown in FIG. 7c and, in more detail, in FIG. 8. In each row i, all 2n gate contacts of MTijL and MtijR (i=1 . . . n) are connected in parallel as shown in FIG. 7c and, in more detail, in FIG. 8.

Passivation Deposition

The passivation layer is any electrically insulating layer preventing electrical contact between crossing leads. It is preferably $SiO_2$, $Si_3N_4$, $Al_2O_3$ or polyimide. It is deposited by any appropriate deposition technique. The thickness is sufficient such that electrical isolation between crossing leads is achieved and is preferably in the range from 10 nm to 1000 nm, more preferably in the range from 50 nm to 500 nm.

Contact Via Etch

Via holes are etched on positions where contact needs to be made between underlying layers, such as ohmic contacts, and subsequent layers such as read-out leads. The via etch mask can be aligned as in previous processing steps. The via etch is performed by any etch technique, including wet etch and dry etch techniques.

Read-Out Leads Metallization

Read-out leads can be aligned and deposited in a similar way as the current leads. They run perpendicular to and over both the current leads and the gate contact leads as shown in FIG. 7d and, in more detail, in FIG. 8. The read-out leads do not make electrical contact to neither the current leads nor the gate contact leads since they are electrically isolated from each other by the insulating passivation layer.

Additional Processing Steps

Additional processing steps can be performed such as e.g. deposition of a protective layer, a layer containing magnetic particles or a magnetic film, a via etch freeing the active Hall sensor regions, etc.

In another embodiment, the Hall sensor array is processed in silicon by a CMOS technology. FIGS. 19 and 20 show a possible lay-out for such processing. In such process, the substrate is preferably lowly doped p-type silicon. The Hall sensor areas HSij are preferably n-well. The Tij, Bij, Lij and Rij contacts are preferably n+-diffusion. The MOS transistors TijT, TijB, TijL and TijR, acting as switches, are preferably nMOS or pMOS transistors. The gate of these MOS transistors is preferably heavily doped polysilicon or metal. The gate oxide is preferably $SiO_2$ with a thickness preferably in the range from 1 nm to 20 nm. p+ contacts are used for contacting the substrate (SUB in FIG. 19). Metal 1 interconnects are preferably used to connect the Tij, Bij, Lij and Rij contacts of the Hall sensor to the drain contacts of the TijT, TijB, TijL and TijR transistors respectively. The TijT, TijB, TijL and TijR transistors may also be integrated in the Hall sensor itself without the need for a metal interconnect between the Tij, Bij, Lij and Rij contacts of the Hall sensor and the drain contacts of the TijT, TijB, TijL and TijR transistors respectively. Contact windows are used to make electrical contact between the metal 1 level and the semiconductor. The metal 2 level allows crossing of electrodes without making electrical contact. Electrical contact between metal 1 and metal 2 levels is obtained using via holes.

In yet another embodiment, the Hall sensor array is processed in silicon in a biCMOS technology.

Example 3

Apparatus

A two-dimensional Hall sensor array chip (FIG. 9) has been developed and successfully tested. This prototype was processed from a delta doped GaAs/AlGaAs wafer. The chip contains several two-dimensional Hall sensor arrays of varying dimensions ranging from 1×1 (single Hall sensor) to 10×10, as well as single HEMT transistors.

The gate dielectric is a 10 nm thick $Al_2O_3$ oxide. The passivation layer is a 100 nm thick $SiO_2$ layer.

Several tests have been done in order to characterize these devices. Their results demonstrate the successful operation of the two-dimensional Hall sensor array.

Transistor Characterization

Figure 10:
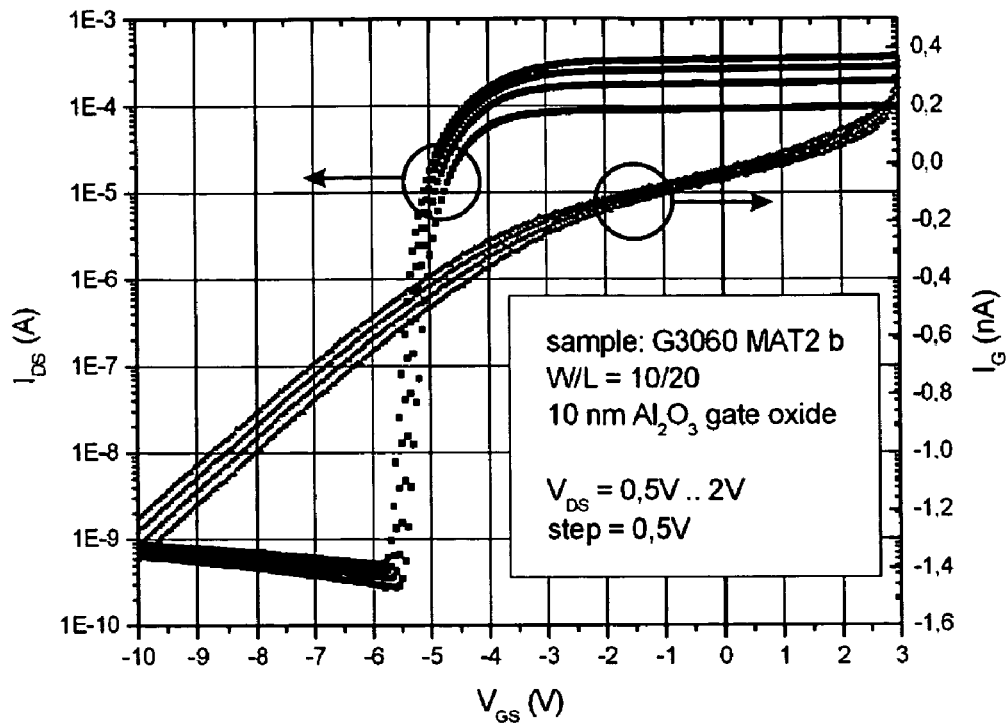
FIG. 10 is a graphic view of IDS (left axis) and IG (right axis) vs VGS as measured for a GaAs/AlGaAs HEMT transistor.

Individual HEMT transistors have been tested and characterized. FIG. 10 shows the drain-source current and the gate leakage current as a function of the gate-source voltage with constant $V_{DS}$ between 0.5V and 2V. For $V_{GS}$=0V, the transistor channel is conducting. For $V_{GS}<V_T$, the drain-source current has dropped several orders of magnitude and the resistance has thus increased several orders of magnitude. The residual current is the leakage current from the gate, which flows to the drain. This gate leakage current is very small (in the order of 100 pA in this example) due to the use of the gate oxide.

Hall Sensor Characterization

Figure 11:
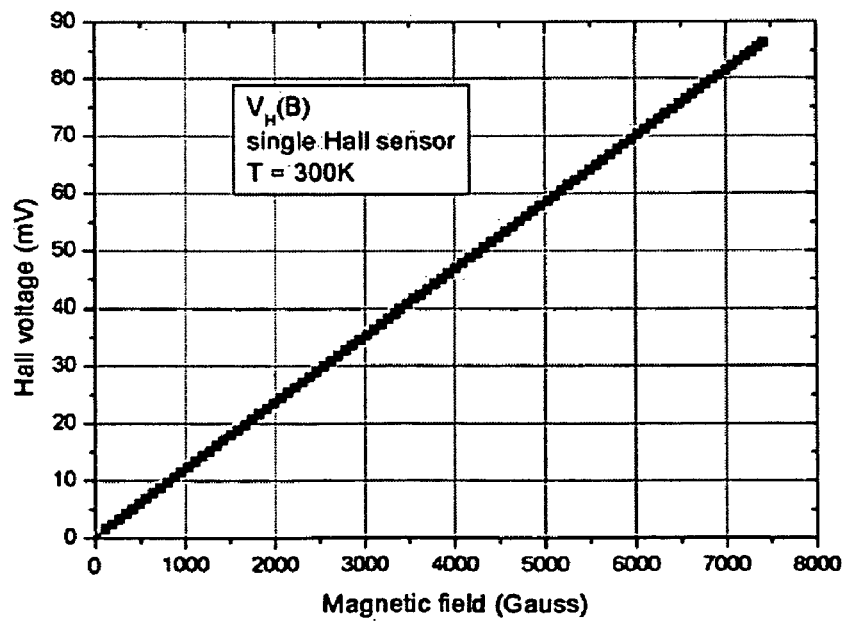
FIG. 11 is a graphic view of linear dependence of the measured Hall voltage of a Hall sensor on the perpendicular magnetic field.

FIG. 11 shows the linear behaviour of the Hall voltage $V_H$ vs the magnetic field perpendicular to the Hall sensor. The slope of this curve, divided by the sensing current through the Hall sensor, is the sensitivity of the Hall sensor. This particular Hall sensor has a sensitivity of 116 mV/A Gauss. The sensing current through the Hall sensor is 100 µA in this example.

Switching Characterization

Figure 12:
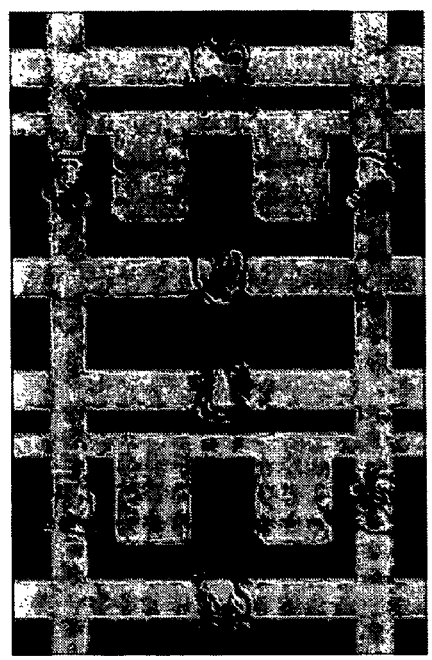
FIG. 12 displays an optical microscopy image of a 2×1 Hall sensor array. For an indication of the different parts, see FIG. 8.

Tests have been done in order to characterize the response of a two-dimensional Hall sensor array to the sweeping of the gate voltage on the transistors. The basic configuration is a 2×1 array (FIG. 12), i.e. two Hall sensors placed in one column.

Figure 13A:
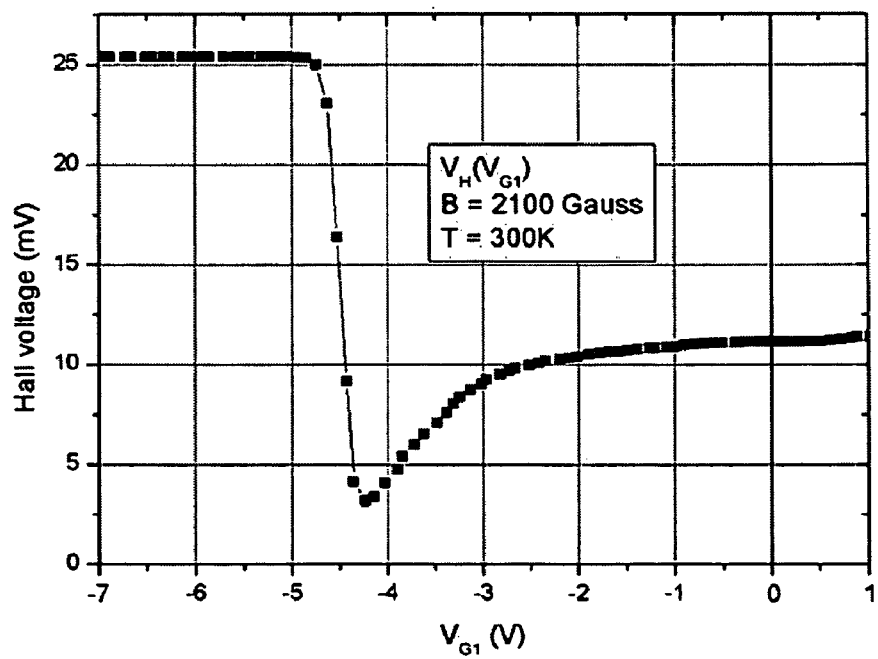
FIG. 13a is a graph illustrating the measured Hall voltage VH vs VG1 and FIG. 13b is a graph illustrating the measured Hall voltage VH vs VG2, both in a 2×1 Hall sensor array.
Figure 13B:
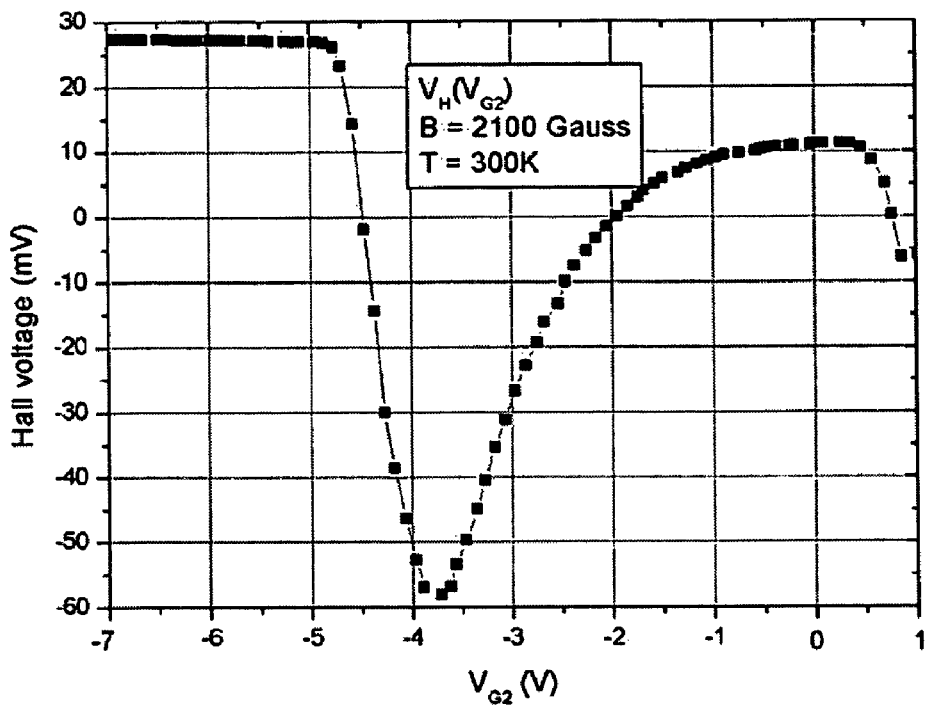

Using the notation of FIG. 2b, the test was done as follows. The By electrodes of both sensors are grounded. In a first measurement Hall sensor (1,2) is the active sensor and sensor (1,1) is the passive sensor, such that VI_1=GND; VI_2=VDD; Vg_2=GND. VI_2=VDD provides the sensing current IH (=100 µA in this case) to the active Hall sensor. A constant perpendicular homogeneous magnetic field of 2100 Gauss is applied to the array. The gate voltage of the transistors of the passive Hall sensor Vg_1 is swept from +1V to −7V. The Hall voltage $V_H$ is measured as a function of Vg_1 (we omit the column index j in "VH" since there is only one column). FIG. 13a shows the result of this measurement. Switching the roles of active and passive sensor, a similar measurement was done, of which the result is shown in FIG. 13b. (In FIGS. 13a and b "Vg_i" is written as "$V_{Gi}$".)

Three regions are distinguished in these graphs. First, for Vg_i=0V (i=1 or 2, depending on which Hall sensor is the passive one) the Hall voltage is lower than the corresponding value of the reference Hall sensor (see FIG. 11) for the same magnetic field and the same sensing current IH. Second, when Vg_i decreases, the Hall voltage first decreases, reaches a minimum and then increases again. Third, $V_H$ saturates when Vg_i is below a certain threshold voltage.

Figure 14:
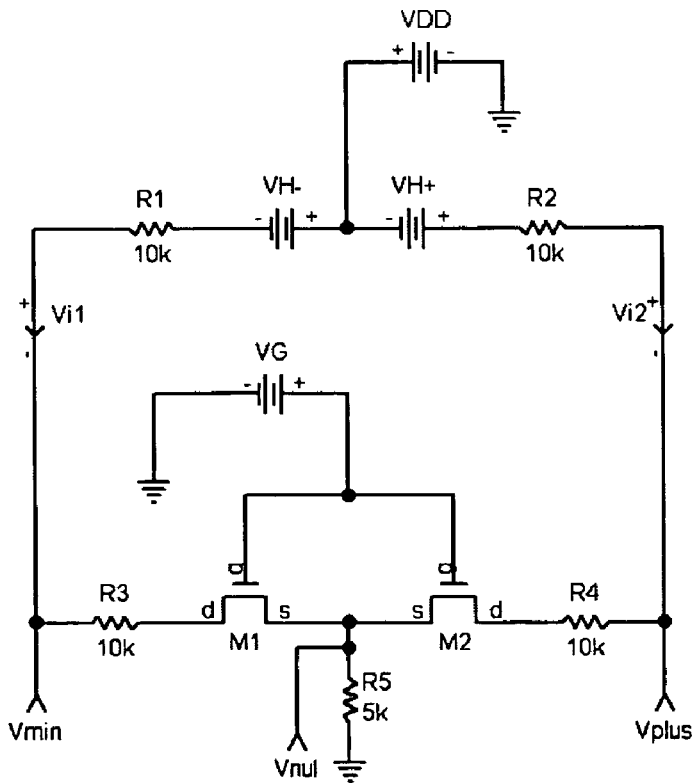
FIG. 14 is a schematic view of a simple equivalent circuit of a 2×1 Hall sensor array.

This behaviour can be understood by analysing a DC equivalent electrical circuit. A simple model is shown in FIG. 14. The upper part represents the active Hall sensor, biased at a certain voltage VDD and generating a Hall voltages VH− and VH+ at the left and right side respectively. The lower part represents the passive Hall sensor, comprising two transistors M1 and M2 (corresponding to MT21L and MT21R in the notation of FIGS. 2a and 2b) and a path to ground in between these two transistors. A gate voltage VG (playing the role of Vg_2) is applied to both M1 and M2. Vmin and Vplus are read out and correspond to voltages VH−,1 and VH+,1 respectively in the notation of FIG. 2b.

From this model the three regions in the VH vs Vg_i graphs of FIG. 13a and b can be qualitatively understood. For VG=0V M1 and M2 are conducting and there hence exists a path from the biased active Hall sensor to ground. This path goes from the active hall sensor arms (corresponding to contacts Lij and Rij in FIG. 2b), parallelly via the Vmin and Vplus read-out leads through the pass transistors M1 and M2 to ground. Therefore IR voltages are superimposed on the voltages (VDD+VH−) and (VDD+VH+) generated at the left and right arm (corresponding to contacts Lij and Rij in FIG. 2b) of the active Hall sensor, resulting in a reduction of the voltages Vplus, Vmin and Vplus−Vmin.

In the second region of the graphs in FIGS. 13a and b, the dip in the read-out voltage can be reproduced in the model by setting the threshold voltages of the transistors M1 and M2 (being $V_{T1}$ and $V_{T2}$ respectively) to different values. Depending on the sign of $V_{T1}-V_{T2}$, either a local minimum or a local maximum is observed in the simulation.

The third region can be understood by realizing that for VG<min($V_{T1},V_{T2}$) no leakage path exists anymore such that no currents are flowing ("min($V_{T1},V_{T2}$)" stands for the lowest (i.e. most negative in this case) value among $V_{T1}$ and $V_{T2}$). Therefore the Hall voltage is transferred to the read-out leads unaltered.

Figure 15:
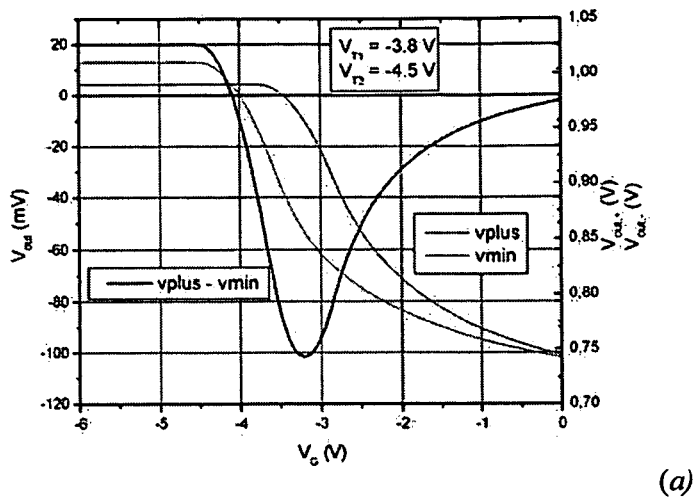
FIG. 15 is a graph with Vplus, Vmin and Vplus−Vmin vs VG for (a) VT1<VT2, (b) VT1=VT2 and (c) VT1>VT2. The curves are simulated from the equivalent circuit illustrated in FIG. 14 using Visual Spice software.
Figure 15:
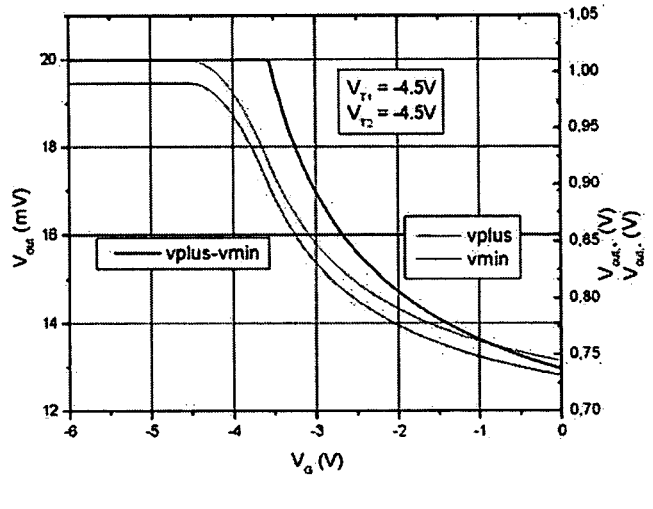
Figure 15:
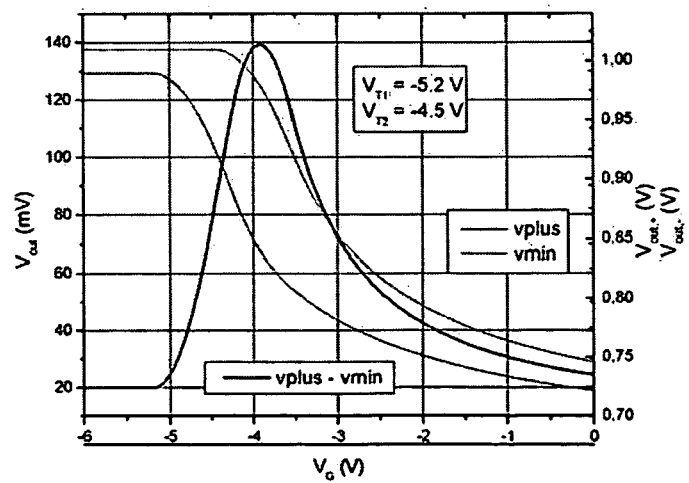

FIGS. 15(a), (b) and (c) show the simulated Vplus, Vmin and Vplus−Vmin vs VG for the cases in which $V_{T1}<V_{T2}$, $V_{T1}=V_{T2}$ and $V_{T1}>V_{T2}$ respectively. Comparing FIG. 15a to FIG. 13b, a qualitative agreement between experiment and simulation is observed.

Figure 16:
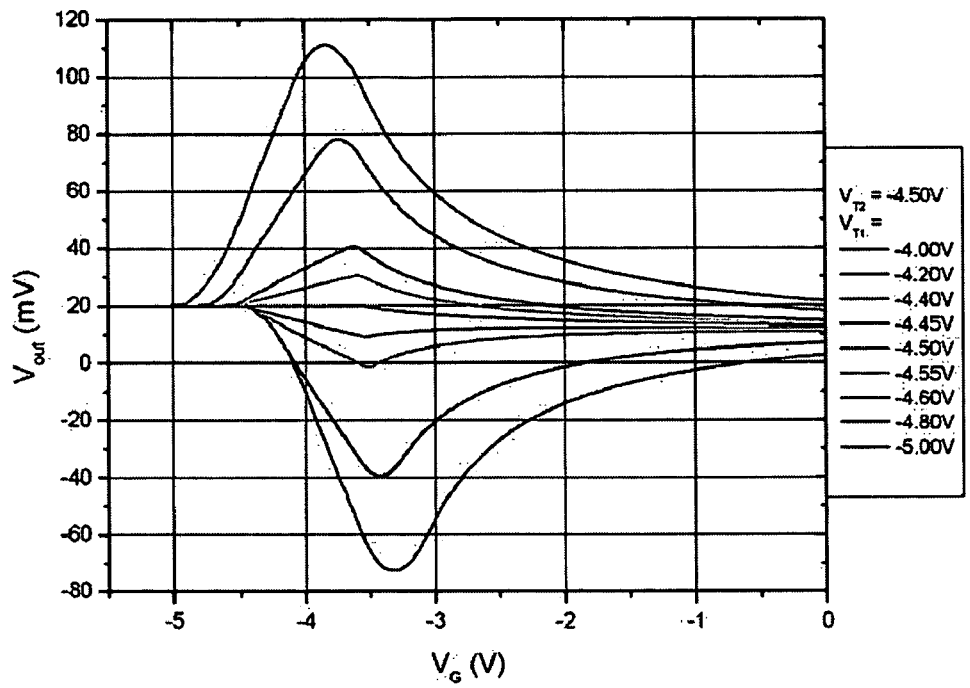
FIG. 16 is a graph with Vout=Vplus−Vmin vs VG for different VT1, while VT2 is kept constant. The curves are simulated from the equivalent circuit from FIG. 14 using Visual Spice software.

Simulating Vplus−Vmin vs VG while keeping $V_{T2}$ constant and stepping $V_{T1}$, results in FIG. 16. This result indicates that Vout=Vplus−Vmin saturates to the same value when VG is below the lowest threshold voltage. The exact Hall voltage is thus read-out, independent of the exact characteristics of the transistors M1 and M2. Since the working regime of the two-dimensional Hall sensor array lies in this saturation regime, the exact $V_{T1}$ and $V_{T2}$ do not affect the operation of the array. However, when VG=0V, Vout does depend on the exact values of $V_{T1}$ and $V_{T2}$. These differences are statistic in nature and due to spatial fluctuations in the fabrication process. Operating the two-dimensional Hall sensor array without depleting the transistors therefore is unreliable.

Figure 17:
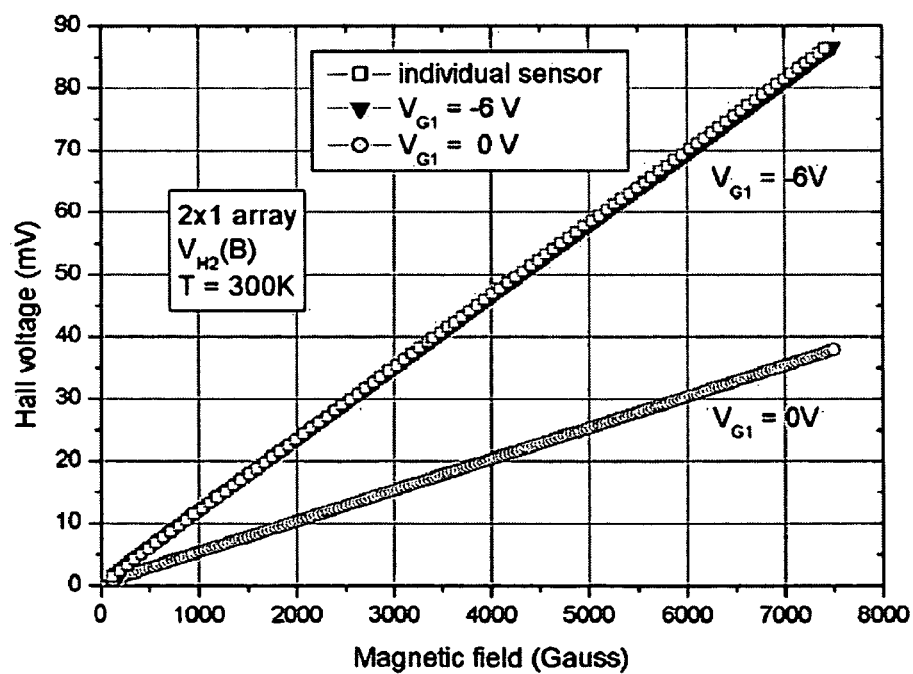
FIG. 17 is a graph demonstrating the measured read-out signal as a function of magnetic field in a 2×1 Hall sensor array. When the passive sensor is not isolated by the pass transistors (VG1=0V), a reduction in sensitivity is observed. Isolating the passive sensor (VG1=−6V<VT) perfectly restores the sensitivity to that of an individual reference Hall sensor ("individual sensor").
Figure 18A:
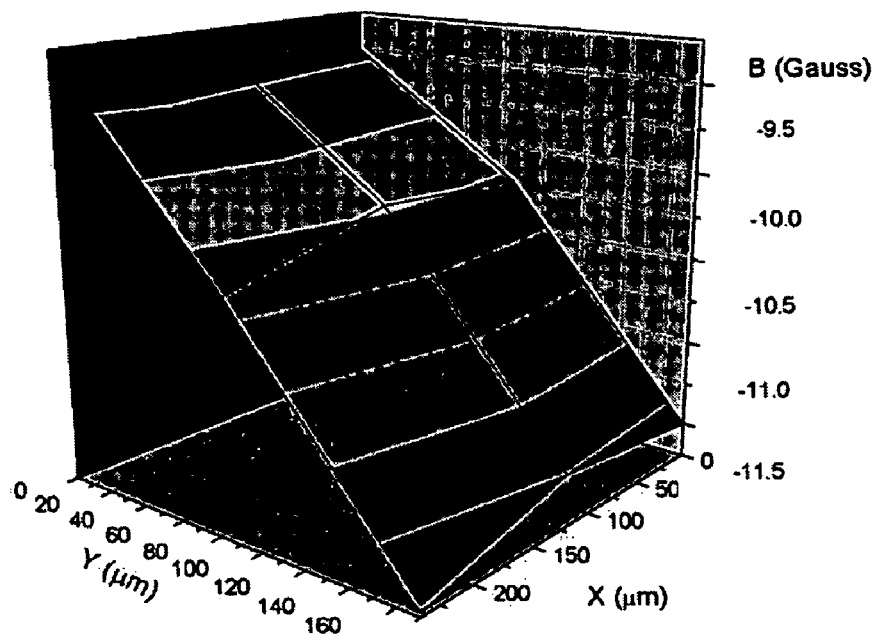
FIG. 18 is a graphic display of magnetic field profiles of a permanent magnet measured with a 3×3 Hall sensor array at 6 different distances from the magnet ((a) through (f)). Each measurement is displaced one row with respect to the former. The magnetic field value read out by each sensor in the array shifts along with the displacement of the magnet. This is seen by inspecting the axis indicated by 'B (Gauss)' and noting that the values shift in subsequent images from (a) to (f).
Figure 18B:
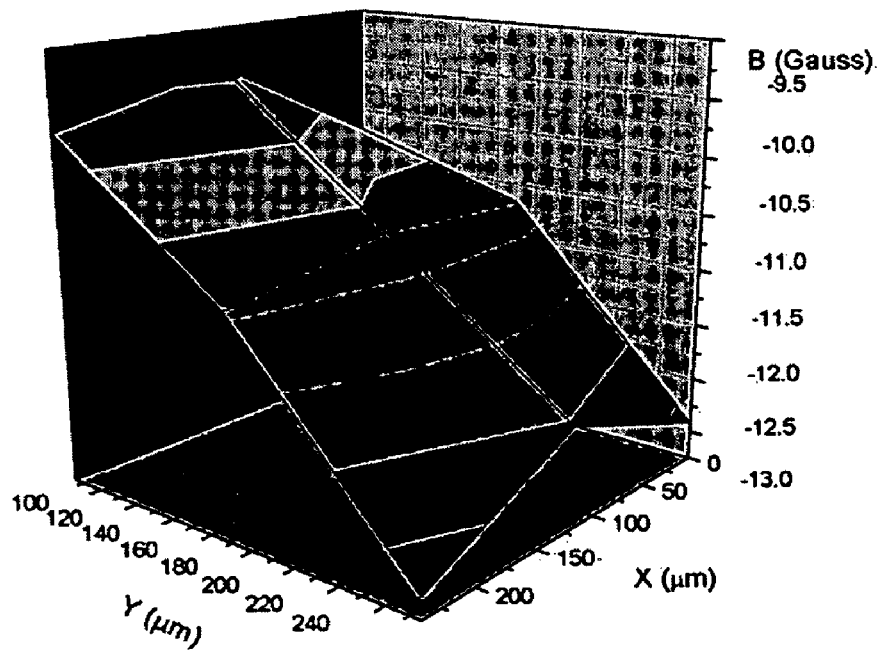
Figure 18C:
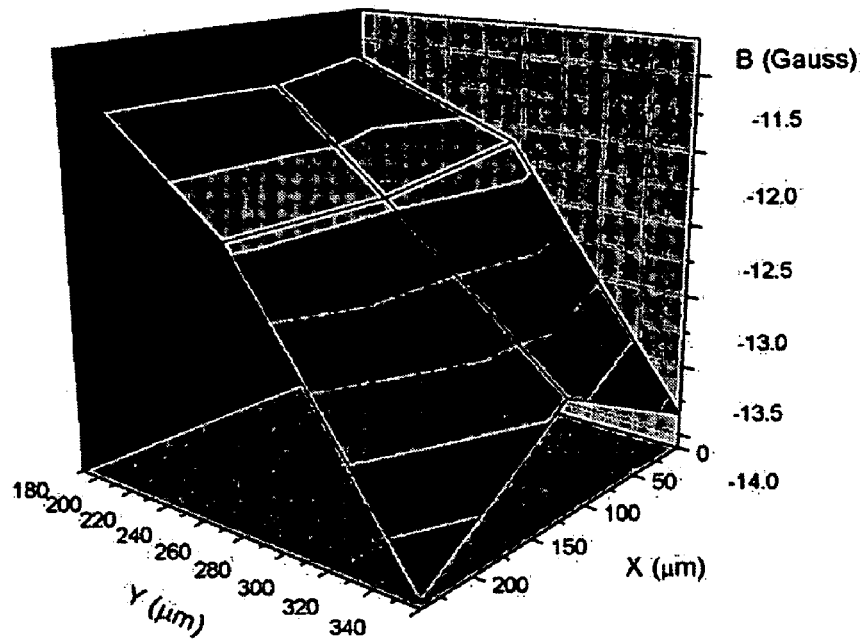
Figure 18D:
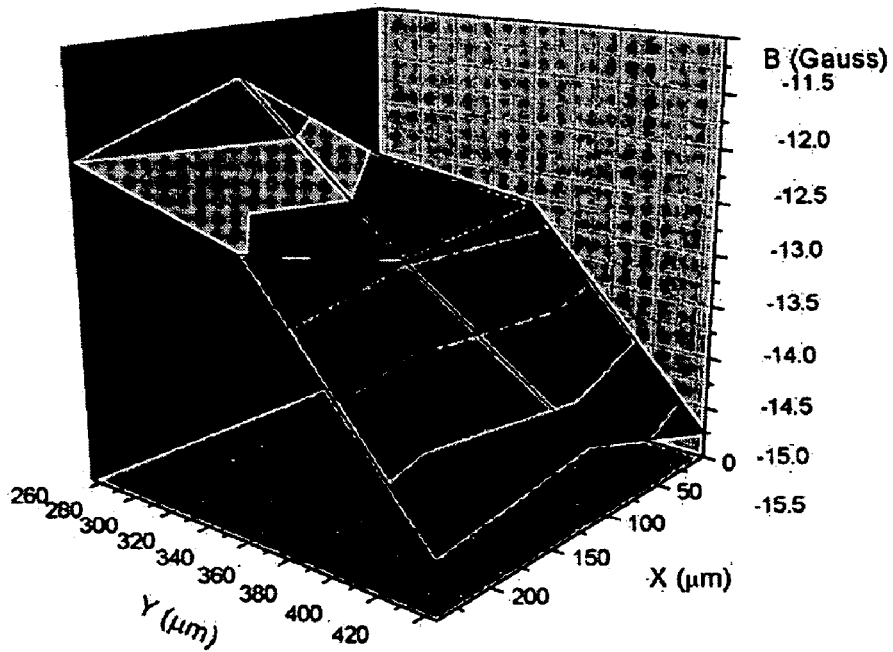
Figure 18E:
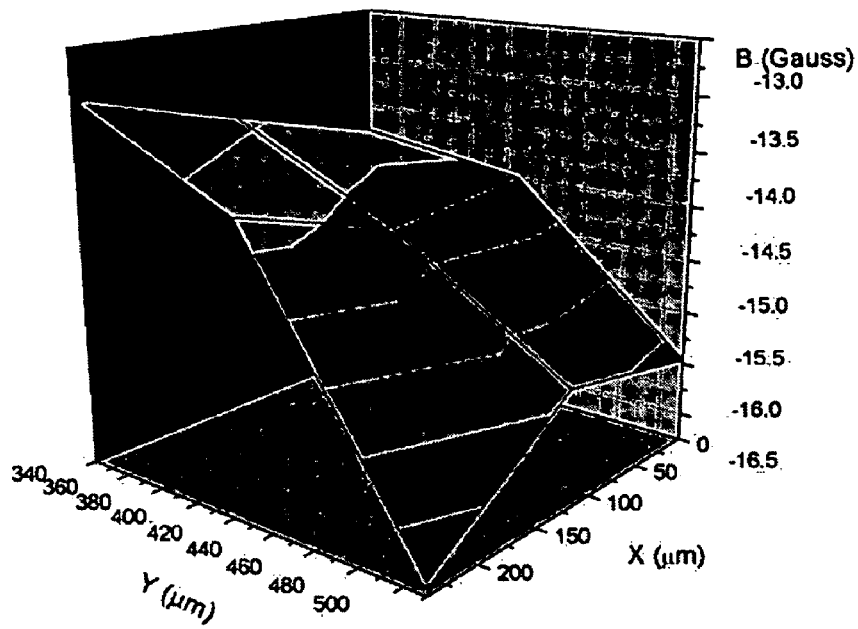
Figure 18F:
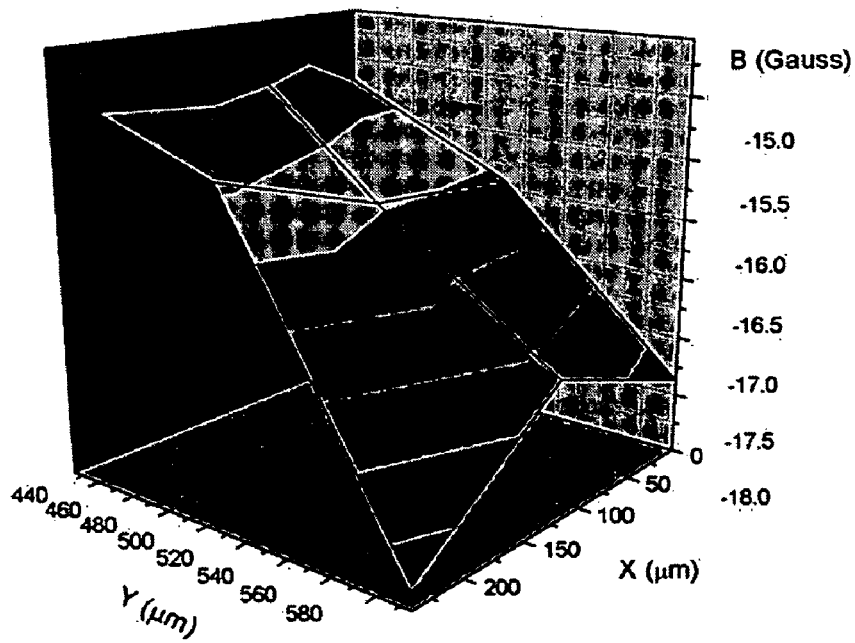

Concluding this section, FIG. 17 shows the experimentally observed Hall voltage as a function of magnetic field of an individual Hall sensor and of a 2×1 Hall sensor array both when the passive sensor is not isolated by its transistors and when the passive sensor is isolated by its transistors. When the passive sensor is not isolated, the response is still linear, but the sensitivity (i.e. the slope of the curve, divided by the sensing current IH) is substantially reduced. IH was the same in all measurements. Isolating the passive sensor perfectly restores the response of the active Hall sensor in the array to that of an individual Hall sensor.

"Magnetic Camera" Operation

The "magnetic camera" operation of the two-dimensional Hall sensor array is demonstrated by measuring the magnetic field profile of a permanent magnet by a 3×3 Hall sensor array. In order to demonstrate that each individual Hall sensor acts as an independent sensor, after reading out the entire array, the magnet was displaced one row period (in the Y-direction, see FIG. 9). Suppose sensor (i,j) reads a value b in measurement number k, in measurement number k+1 (when the magnet has been displaced one row) sensor (i−1,j) should read value b. In measurement k+2 sensor (i−2,j) should read value b, etc.

FIG. 18 shows six subsequent measurements, each measurement the magnet is brought closer to the 3×3 array by one period in the Y direction. In the first measurement the first row (Y=0) is taken as reference for the displacement.

It is seen from subsequent graphs that the field which is read out shifts along with the displacement of the magnet. This shows that each Hall sensor in the two-dimensional array acts as an independent Hall sensor.

By using high-sensitivity two-dimensional Hall sensor arrays with larger dimensions, such as 128×128 (or other) arrays, more detailed images can be made of spatially varying and time-dependent magnetic fields.

Example 4

Applications

A broad range of applications can be imagined for the high-resolution two-dimensional Hall sensor array according to certain embodiments. High-resolution detection and imaging of spatially varying and time-dependent magnetic fields is a very challenging and technologically important issue. Local magnetic field distribution is a key factor for the optimization of the performance of modern devices and for executing a variety of tasks. Applications include:

Magnetic memories, including super dense memories.
Monitoring and controlling local fields generated by processors and other integrated circuits.
Fast monitoring of defects and failures in the products made from magnetic materials on conveyor belts.
Monitoring and controlling local magnetic field maps in a variety of practical superconducting materials such as thin films for cryo-electronic applications (bolo meters, high-frequency filters, SQUID sensors and other superconducting devices), superconducting tapes and wires for superconducting magnets for MRI applications and superconducting solenoids for the research in high magnetic fields.
For in-built sensors of the earth magnetic field in a variety of portable consumer devices such as mobile phones, CD players, watches, etc.
2D and 3D high-precision positioning and tracking of objects.

As relevant sizes shrink in microelectronics and other industries, there is an increasing need in the art for high-precision positioning and magnetic field detection and imaging, both in space and time. One inventive aspect fulfils this need by a new method to realize a true two-dimensional high-resolution Hall sensor array for detecting spatially varying and time-dependent magnetic fields.

The "magnetic camera" operation can be applied in high-resolution two-dimensional and three-dimensional imaging techniques such as Scanning Hall Probe Microscopy, eliminating the time-consuming need for one- or two-dimensional scanning and hence allowing for highly time-resolved phenomena to be detected and imaged. Examples are magnetic flux line dynamics in nanostructured superconductors, fast switching of magnetic nanocontacts for use in e.g. spintronics applications etc.

It can also be used for visualizing-defects (microcracks, inclusions etc.) in (magnetic) materials such as steel, iron etc. When an external magnetic field is applied to the material surface, a defect located near the surface will disturb the magnetic field lines inside the material, causing these to emanate from the surface. These stray fields can be visualized by placing the 2D Hall sensor array near (and preferably parallel to) the surface and reading out the array. A 'magnetic image' of the defect is thus obtained.

In security devices such as finger print detectors, the 2D Hall sensor array can be used by coating the array with an elastic film, in which a magnetic film is integrated. By pressing a finger on this film, the magnetic film will adapt to the topology of the finger, which is detected by the underlying 2D Hall sensor array. The same principle can be used to map any spatially varying pressure distribution.

Proton exchange membrane (PEM) fuel cells are promising, emission-free methods of producing electricity for transportation and other applications. They are used to provide power during e.g. space flights. One way of characterizing these PEM fuel cells is to map the magnetic field produced by the electrochemical currents flowing in an active fuel cell. This task can be performed by a 2D Hall sensor array, especially when these cells are reduced in size as to serve as power supply in small devices.

Another large class of applications is high-resolution two- and three-dimensional positioning in a variety of devices by e.g. monitoring the position of one or more small permanent magnets relative to a 2D Hall sensor array. Since the magnetic field generated by the permanent magnet rapidly falls off with distance, its position can be accurately determined in three dimensions by determining its in-plane position from the maximum magnetic field observed in the two-dimensional array. The third dimension (i.e. the height above the array) can be included by taking into account the intensity of the magnetic field at this in-plane maximum.

Possible applications of this 3D-positioning system (with or without a feedback system) include high precision alignment devices in micro- and nanoelectronics lithography processing, telescope mirror positioning, high-resolution 3D track monitoring of moving objects such as nano-resonators and other oscillating objects, etc. Another application is movement control in e.g. critical surgical operations like brain operations, performed by a remotely controlled robot.

Also strain effects in chip packaging processes can be monitored by positioning a 2D Hall sensor array close to an IC and providing the latter of one or more magnetic markers. Absolute or relative shifts in the position of the markers can indicate strain effects in the package.

Since the 2D Hall sensor array is compatible with standard semiconductor processing, it can be integrated in or combined with other semiconductor chips. This way it can be used for circuit fault detection in processors and other integrated circuits by e.g. monitoring the stray fields of electrical currents on the chip.

For these and other purposes, additional flux concentrators can be used in order to concentrate magnetic fields to the Hall sensor array and hence increase its sensitivity.

Another field of application is biotechnology. The concept of "lab-on-a-chip" integrates all necessary components for e.g. separation, filtering, detection etc. of bio molecules such as proteins and peptides or specific cells onto one chip. Sensors play a crucial role in this concept. One way of detecting specific cells or bio molecules is using magnetic labeling, in which small surface-treated magnetic particles (such as magnetic micro- and nanobeads) specifically attach to one particular kind of cell or molecule. Detecting the cells or molecules is achieved through detecting the magnetic labels. Our 2D Hall sensor array can serve as a detector for these magnetic labels, monitoring their movements, determining their distribution in space and time, etc., thus providing information about the cells or molecules attached to them. In general, localization and tracking of any magnetic marker or markers brought into any organism can be performed with our 2D Hall sensor array.

While the above detailed description has shown, described, and pointed out novel features of the invention as applied to various embodiments, it will be understood that various omissions, substitutions, and changes in the form and details of the device or process illustrated may be made by those skilled in the art without departing from the spirit of the invention. The scope of the invention is indicated by the appended claims rather than by the foregoing description. All changes which come within the meaning and range of equivalency of the claims are to be embraced within their scope.

The invention claimed is:

1. A magnetic field sensor device, comprising
a measuring element comprising a semiconductor material,
a first means for providing current through the measuring element, the current flowing along a first path between a first set of 2 contacts,
a first means for measuring voltage over a second set of 2 contacts, each contact of the second set of 2 contacts being located electrically on different sides of the first path,
a first means for electrically isolating the first set of contacts from the second set of contacts, wherein the first means for electrically isolating the first set of contacts from the second set of contacts comprises a first set of at least two switches.

2. The device according to claim 1, wherein the first path is essentially straight when looked upon from above.

3. The device according to claim 1, wherein the measuring element is cross shaped, being built up of 2 intersecting cross bars, and the contacts of the first set of 2 contacts and of the second set of 2 contacts are each located at different end portions of a first and a second cross bar respectively.

4. The device according to claim 1, wherein the measuring element is rectangular or square shaped.

5. The device according to claim 1, wherein the measuring element comprises one or more of the following: Silicon, germanium, GaAs, GaSb, InAs, InSb, InGaAs, InAlAs, InP, GaN and another III-V material.

6. The device according to claim 1, wherein the measuring element is a heterostructure, the element comprising a GaAs/AlGaAs interface.

7. The device according to claim 1, wherein the measuring element is a heterostructure, the element comprising a GaN/AlGaN interface.

8. The device according to claim 1, wherein the measuring element comprises an organic or polymer material.

9. The device according to claim 1, wherein the first set of switches comprises a first set of transistors.

10. The device according to claim 9, wherein the first set of transistors comprises first areas of the measuring element.

11. The device according to claim 10, wherein for the first set of transistors, the first areas of the measuring element form channels of the first set of transistors.

12. The device according to claim 10, wherein the first areas of the measuring element are at least partially covered with a conductive layer, the conductive layer forming a control electrode of a transistor.

13. The device according to claim 12, wherein the control electrode is further separated from the measuring element by an electrically isolating layer.

14. The device according to claim 1, further comprising
a second means for providing current through the measuring element, the current flowing along a second path between the second set of two contacts;
a second means for measuring voltage over the first set of two contacts, each contact of the first set of two contacts being located electrically on different sides of the second path; and
a second means for electrically isolating the first set of contacts from the second set of contacts.

15. The device according to claim 14, wherein the second means for electrically isolating the first set of contacts from the second set of contacts comprises a second set of at least two switches.

16. The device according to claim 15, wherein the second set of switches comprises a second set of transistors.

17. The device according to claim 16, wherein the second set of transistors comprises second areas of the measuring element.

18. The device according to claim 17, wherein for the second set of transistors, the second areas of the measuring element form channels of the second set of transistors.

19. The device according to claim 17, wherein the second areas of the measuring element are at least partially covered with a conductive layer, the conductive layer forming a control electrode of a transistor.

20. The device according to claim 19, wherein the control electrode is further separated from the measuring element by an electrically isolating layer.

21. The device comprising a plurality of magnetic field sensors according to claim 1, wherein the devices are arranged logically organized in rows and columns in a 2-dimensional matrix.

22. The device according to claim 21, wherein at least one switch of the first set of switches, for each element in a row, is connected to a first common electrically conductive line, this for each row.

23. The device according to claim 21, the device being configured to perform one or more of the following functions: high-resolution two-dimensional and three-dimensional magnetic imaging, defect detection in materials, finger print detection, high-resolution two- and three-dimensional positioning, monitoring the position of one or more small permanent magnets relative to the 2-dimensional matrix, 3D track monitoring of moving objects, movement control, automated movement control in surgical operations, detecting strain effects in chip packaging processes, and detecting magnetic labels used in biotechnology applications.

24. The device according to claim 22, wherein the other switch of the first set of switches, for each element in a row, is connected to a second common electrically conductive line, this for each row.

25. The device according to claim 24, wherein the first common electrically conductive line and the second common electrically conductive line are the same.

26. The device according to claim 24, wherein one contact of the first set of contacts for each element in a row, is connected to a third common electrically conductive line, for each row.

27. The device according to claim 26, wherein the other contact of the first set of contacts for each element in a row, is connected to a fourth common electrically conductive line, for each row.

28. The device according to claim 27, wherein one contact of the second set of contacts for each element in a column, is connected to a fifth common electrically conductive line, for each column.

29. The device according to claim 28, wherein the other contact of the second set of contacts for each element in a column, is connected to a sixth common electrically conductive line, for each column.

30. The device according to claim 29, wherein at least one switch of the second set of switches, for each element in a column, is connected to a seventh common electrically conductive line, this for each column.

31. The device according to claim 30, wherein the other switch of the second set of switches, for each element in a column, is connected to an eighth common electrically conductive line, this for each column.

32. The device according to claim 31, wherein the seventh common electrically conductive line and the eighth common electrically conductive line are the same.

33. The device according to claim 1, further comprising a contact to the substrate, the substrate contact being put at a reference potential.

34. A device for sensing magnetic field, comprising
a measuring element comprising a semiconductor material, a first set of two contacts, and a second set of two contacts, each contact being located on different sides of the measuring element;
and
a first set of two switches configured to electrically isolate the first set of contacts from the second set of contacts.

35. The device of claim 34, where the measuring element is configured to generate a voltage between the second set of contacts when a current flows along a first path between the first set of contacts.

36. The magnetic field sensor according to claim 35, wherein the first path is essentially straight when looked upon from above.

37. The device of claim 34, wherein the measuring element is cross shaped, being built up of 2 intersecting cross bars, and each contact of the first and second set of 2 contacts is located at different end portions of a first and a second cross bar respectively.

38. The device of claim 34, wherein the measuring element is rectangular or square shaped.

39. The device of claim 34, wherein the measuring element comprises Silicon, germanium, GaAs, GaSb, InAs, InSb, InGaAs, InAlAs, InP, GaN or another III-V material.

40. The device of claim 34, wherein the measuring element is a heterostructure, comprising a GaAs/AlGaAs interface.

41. The device of claim 34, wherein the measuring element is a heterostructure, comprising a GaN/AlGaN interface.

42. The device of claim 34, wherein the measuring element comprises an organic or polymer material.

43. The device of claim 34, wherein the first set of switches comprises a first set of transistors.

44. The device of claim 43, wherein the first set of transistors comprise first areas of the measuring element.

45. The device of claim 44, wherein for the first set of transistors, the first areas of the measuring element form channels of the first set of transistors.

46. The device of claim 34, further comprising a second set of two switches, each switch being connected to a different one of the second set of two contacts.

47. The device of claim 46, wherein the second set of switches comprises a second set of transistors.

48. The device of claim 47, wherein the second set of transistors comprise second areas of the measuring element.

49. The device of claim 48, wherein for the second set of transistors, the second areas of the measuring element form channels of the second set of transistors.

50. The device comprising a plurality of magnetic field sensors of claim 34, wherein the devices are arranged logically organized in rows and columns in a 2-dimensional matrix.

51. The device of claim 50, wherein at least one switch of the first set of switches, for each element in a row, is connected to a first common electrically conductive line, this for each row.

52. The device of claim 51, wherein the other switch of the first set of switches, for each element in a row, is connected to a second common electrically conductive line, this for each row.

53. The device of claim 52, wherein the first common electrically conductive line and the second common electrically conductive line are the same.

54. The device of claim 53, wherein one contact of the first set of contacts for each element in a row, is connected to a third common electrically conductive line, for each row.

55. The device of claim 54, wherein the other contact of the first set of contacts for each element in a row, is connected to a fourth common electrically conductive line, for each row.

56. The device of claim 55, wherein one contact of the second set of contacts for each element in a column, is connected to a fifth common electrically conductive line, for each column.

57. The device of claim 56, wherein the other contact of the second set of contacts for each element in a column, is connected to a sixth common electrically conductive line, for each column.

58. The device of claim 57, wherein at least one switch of the second set of switches, for each element in a column, is connected to a seventh common electrically conductive line, this for each column.

59. The device of claim 58, wherein the other switch of the second set of switches, for each element in a column, is connected to an eighth common electrically conductive line, this for each column.

60. The device of claim 59, wherein the seventh common electrically conductive line and the eighth common electrically conductive line are the same.

61. The device of claim 34, further comprising a contact to the substrate, the substrate contact being put at a reference potential.

62. A magnetic field sensor device, the device comprising:
a measuring element comprising a semiconductor material and defining a current path between a first set of 2 contacts;
a voltage detector connected between a second set of 2 contacts, each contact of the second set of 2 contacts being located electrically on different sides of the current path; and
a plurality of switches configured to electrically isolate the first set of contacts from the second set of contacts.

* * * * *